US009313016B2

(12) United States Patent
Morita

(10) Patent No.: US 9,313,016 B2
(45) Date of Patent: Apr. 12, 2016

(54) RECEIVER CIRCUIT, COMMUNICATION SYSTEM, ELECTRONIC DEVICE, AND METHOD FOR CONTROLLING RECEIVER CIRCUIT

(71) Applicant: SEIKO EPSON CORPORATION, Tokyo (JP)

(72) Inventor: Akira Morita, Shimosuwa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/376,681

(22) PCT Filed: Feb. 8, 2013

(86) PCT No.: PCT/JP2013/000720
§ 371 (c)(1),
(2) Date: Aug. 5, 2014

(87) PCT Pub. No.: WO2013/121764
PCT Pub. Date: Aug. 22, 2013

(65) Prior Publication Data
US 2015/0049848 A1    Feb. 19, 2015

(30) Foreign Application Priority Data

Feb. 17, 2012   (JP) .................................. 2012-032465

(51) Int. Cl.
*H04L 7/00* (2006.01)
*H04L 7/033* (2006.01)
*H03L 7/00* (2006.01)

(52) U.S. Cl.
CPC ................ *H04L 7/0079* (2013.01); *H03L 7/00* (2013.01); *H04L 7/0037* (2013.01); *H04L 7/0337* (2013.01)

(58) Field of Classification Search
CPC ..... H04L 7/0079; H04L 7/0037; H04L 7/0337; H03L 7/00
USPC .......................................... 375/354
See application file for complete search history.

(56) References Cited

U.S. PATENT DOCUMENTS 6,247,138 B1   6/2001   Tamura et al.
6,484,268 B2  11/2002   Tamura et al.
(Continued)

FOREIGN PATENT DOCUMENTS

JP   A-11-112483   4/1999
JP   A-11-275066  10/1999
(Continued)

OTHER PUBLICATIONS

International Search Report issued in International Application No. PCT/JP2013/000720 mailed Apr. 2, 2013.

*Primary Examiner* — Tanmay Shah
(74) *Attorney, Agent, or Firm* — Oliff PLC

(57) ABSTRACT

A receiver circuit etc. which can receive a high-speed signal is provided without providing a PLL circuit etc. A first receiver circuit for capturing an input signal at a plurality of capture timings determined based on a capture clock signal, includes a delay circuit configured to delay the input signal by a set delay time, and output the delayed input signal, a data latch circuit configured to capture the input signal delayed by the delay circuit at each capture timing, a data test circuit configured to test a latch signal captured by the data latch circuit, and a data test result register configured so that a test result value is set therein. The data test circuit compares the latch signal captured by the latch circuit at each capture timing with an expected value, and outputs the result of the comparison.

20 Claims, 16 Drawing Sheets

(56) References Cited

U.S. PATENT DOCUMENTS

| | | | |
|---|---|---|---|
| 6,530,053 B1 * | 3/2003 | Suda | 714/738 |
| 7,496,781 B2 | 2/2009 | Tamura et al. | |
| 7,538,594 B2 * | 5/2009 | Jia et al. | 327/261 |
| 8,065,553 B2 | 11/2011 | Tamura et al. | |
| 2001/0050584 A1 * | 12/2001 | Tsuiki et al. | 327/233 |
| 2002/0097077 A1 | 7/2002 | Tsuiki et al. | |
| 2002/0097078 A1 | 7/2002 | Tsuiki et al. | |
| 2005/0125840 A1 | 6/2005 | Anderson et al. | |
| 2006/0280274 A1 | 12/2006 | Okuyama | |
| 2009/0033340 A1 * | 2/2009 | Kurkovskiy et al. | 324/656 |
| 2012/0274373 A1 * | 11/2012 | Ku | 327/158 |
| 2013/0214752 A1 * | 8/2013 | Tournatory | 323/274 |

FOREIGN PATENT DOCUMENTS

| | | |
|---|---|---|
| JP | A-2001-167064 | 6/2001 |
| JP | A-2005-303753 | 10/2005 |
| JP | A-2006-324818 | 11/2006 |
| JP | A-2009-284176 | 12/2009 |
| JP | A-2009-302672 | 12/2009 |
| JP | A-2010-74615 | 4/2010 |
| JP | A-2010-191872 | 9/2010 |
| JP | A-2012-191650 | 10/2012 |
| WO | WO 2005/039148 A1 | 4/2005 |

* cited by examiner

FIG. 8

| | DT1 | DT2 | DT3 | DT4 | DT5 |
|---|---|---|---|---|---|
| T1 | H | H | L | L | L |
| T2 | L | H | H | H | L |
| T3 | L | L | L | H | H |

FIG. 9

| | DT1 | DT2 | DT3 | DT4 | DT5 | DT6 | DT7 |
|---|---|---|---|---|---|---|---|
| T1 | H | L | L | L | L | L | L |
| T2 | L | L | H | H | H | L | L |
| T3 | L | L | L | L | L | L | H |

| DESCRIPTION | ACTUAL MEASUREMENT VALUE (ns) |
|---|---|
| PROCESS VARIATION | 0.2 |
| TEMPERATURE CHARACTERISTICS | 0.23 |
| MEASUREMENT VARIATION | 0.09375 |
| MACHINE DIFFERENCE VARIATION OF MEASURING DEVICE | 0.0625 |
| PROBE CAPACITY DELAY | 0.0625 |
| MEASUREMENT RESOLUTION | 0.03125 |
| VARIATION | 0.68 |
| REQUIRED SETUP TIME | 0.8 |
| REQUIRED HOLD TIME | 0.8 |
| 1/2 OF PERIOD | 2.28 |

FIG. 16

FIG. 17A  TRANSMITTER
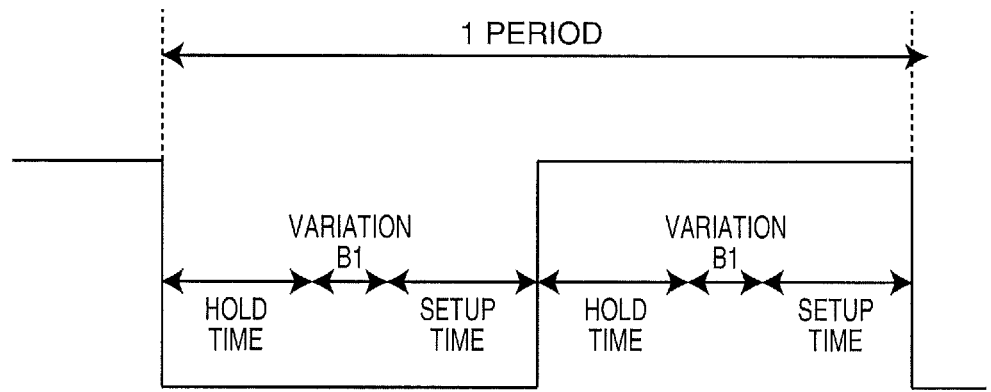
FIG. 17B  RECEIVER
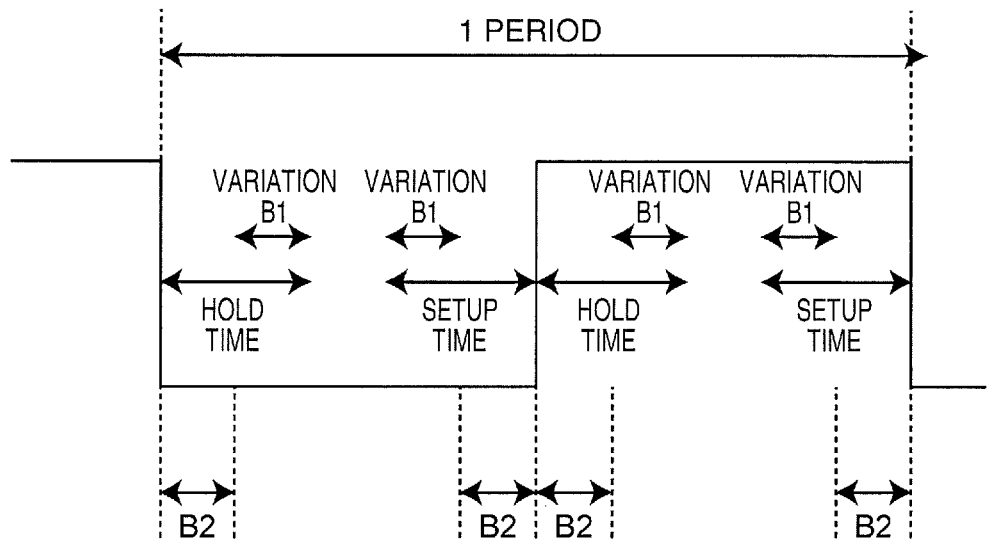

RECEIVER CIRCUIT, COMMUNICATION SYSTEM, ELECTRONIC DEVICE, AND METHOD FOR CONTROLLING RECEIVER CIRCUIT

CROSS-REFERENCE TO RELATED APPLICATIONS

This application claims priority to Japanese Patent Applications No. 2010-032465 file on Feb. 17, 2012. The entire disclosure of Japanese Patent Applications No. 2012-032465 is hereby incorporated herein by reference.

TECHNICAL FIELD

The present invention relates to receiver circuits, communication systems and electronic devices including a receiver circuit, methods for controlling a receiver circuit, and the like.

BACKGROUND ART

Conventionally, an integrated circuit device can be connected, only by the input-output characteristics thereof being guaranteed, to another integrated circuit device such that the devices function as a communication system in which one of the devices serves as a transmitter and the other serves as a receiver. However, the frequency of an interface signal between integrated circuit devices has reached a range exceeding 200 MHz to 400 MHz, and therefore, the difference in timing between different signals has posed a problem. In particular, some difference in timing between a clock signal and a data signal which is transmitted in synchronization with the clock signal or some difference in timing between data signals may lead to a situation that a data signal cannot be correctly captured.

To address such a problem, for example, a SerDes (SERializer/DESerializer) etc. may be used in which a clock signal and a data signal are superimposed on a single line using an algorithm, and transmit and receive the resultant signal.

Also, for example, Patent Literature 1 discloses a data transmission circuit in which a skew between data signals is reduced to the extent possible. Specifically, in the data transmission circuit, the drive ability at a transmitter side is modified to eliminate or minimize the time difference between a reception timing and a predetermined intended timing when a predetermined signal is transmitted over each of a first transmission path and a second transmission path.

CITATION LIST

Patent Literature

Patent Literature 1: JP-A-2010-74615

SUMMARY OF INVENTION

Technical Problem

However, when SerDes etc. is employed or when the technology disclosed in Patent Literature 1 is employed, a PLL (Phase-Locked Loop) circuit is required in the receiver, disadvantageously leading to an increase in circuit size of the receiver. Also, in the technology disclosed in Patent Literature 1, parasitic resistance, parasitic capacitance, etc. may vary from transmission path to transmission path due to a difference in interconnect layout or interconnect length, etc. Therefore, the degree of adjustment of a skew varies from transmission path to transmission path, resulting in a problem that a skew cannot be highly accurately adjusted.

Also, for characteristics of an integrated circuit device, it is necessary to consider process variations depending on a manufacturing process, temperature characteristics, measurement variations, machine difference variations of a measuring device, delay due to capacitance of a measuring probe card, measurement resolution, etc.

FIG. 16 shows example variation factors which have an influence on characteristics of an integrated circuit device, and example actual measurement values.

FIGS. 17(A) and 17(B) are diagrams for describing an influence of a variation factor of FIG. 16 on characteristics of an integrated circuit device. FIG. 17(A) is a diagram for describing an influence of a variation factor of FIG. 16 on characteristics of an integrated circuit device as a transmitter. FIG. 17(B) is a diagram for describing an influence of a variation factor of FIG. 16 on characteristics of an integrated circuit device as a receiver.

For example, it is assumed that, for the above variation factors, for example, a 0.18 μm manufacturing process is used, and the values of FIG. 16 are given as actual measurement values. In this case, for each of the setup time and hold time of an integrated circuit device, it is necessary to consider 0.68 ns which is the sum of the values of all of the variation factors.

Here, it is assumed that, using the above manufacturing process, a setup time and a hold time which are characteristics of an integrated circuit device which transmits and receives a signal of, for example, 200 MHz to 400 MHz are 0.8 ns.

In the transmitter, as shown in FIG. 17(A), the timing tolerance value of ½ of the cycle is defined by the hold time (=0.8 ns), a variation error (B1=0.68 ns), and the setup time (=0.8 ns). Therefore, the timing tolerance value of ½ of the cycle is 2.28 ns (≈219 MHz), and transmission of a signal of 400 MHz cannot be guaranteed.

On the other hand, in the receiver, as shown in FIG. 17(B), the variation error is a variation factor of a signal from the transmitter and is therefore included in each of the setup time and the hold time. Therefore, in the receiver, the setup time and the hold time are each 0.12 ns (B2=0.8 ns−B1), and characteristics of an integrated circuit device which receives a signal of 200 MHz to 400 MHz cannot be guaranteed.

Moreover, in addition to the timing tolerance value in the transmitter and the timing tolerance value in the receiver, it is necessary to consider mounting factors of an integrated circuit device on a PCB (Printed Circuit Board), a COF (Chip On Film), a TCP (Tape Career Package), etc. COFs and TCPs are mounted or incorporated into a device in a bent form. Therefore, even if an attempt is made to consider mounting on a COF or a TCP, a problem arises that variations cannot be correctly estimated due to fluctuations in inductance due to flexure, a difference between each flexure degree, etc.

The present invention has been made in order to solve at least a portion of the above problems, and may be implemented in the following forms or embodiments.

Solution to Problem (1) In a first embodiment of the present invention, a receiver circuit for capturing an input signal at a plurality of capture timings determined based on a capture clock signal, includes a delay circuit configured to delay the input signal changing to a first state or a second state by a set delay time, and output the delayed input signal, a latch circuit configured to capture the input signal delayed by the delay circuit at each capture timing, a data test circuit configured to test a latch signal captured by the latch circuit, and a data test result register configured so that a test result value corresponding to a test result of the data test circuit is set therein. The data test circuit compares the latch signal captured by the latch circuit at each capture timing with an expected value, and outputs the result of the comparison.

According to this embodiment, by capturing a predetermined input signal while changing the delay time of the delay circuit, an optimum delay time can be determined. Therefore, if an input signal which is delayed by the determined optimum delay time is captured at a predetermined capture timing, highly accurate data reception can be achieved even in the case of a high-speed signal. As a result, highly accurate reception of a high-speed signal can be achieved using a simple configuration without providing a PLL circuit. Also, the delay time of an input signal can be adjusted, taking into consideration the timing tolerance values of transmitter and receiver circuits, mounting factors in a COF etc., fluctuations in inductance due to flexure of a COF etc., a difference between each flexure degree, etc. Moreover, for each input signal, the delay time can be adjusted, depending on individual variation factors, and therefore, the optimum delay time of the input signal can be determined and adjusted without being affected by a variation factor of another input signal having a small margin.

(2) A receiver circuit according to a second embodiment of the present invention includes, in the first embodiment, a delay value adjustment unit configured to adjust the delay time of the delay circuit based on the test result value so that latch data corresponding to a latch signal captured at each capture timing with respect to each of different delay times set in the delay circuit matches a predetermined first pattern.

According to this embodiment, if the delay time of the delay circuit is changed, an optimum delay time of the delay circuit can be autonomously determined, and the delay circuit can be set to have the optimum delay time. Therefore, in addition to the above advantages, an external control to the receiver circuit can be significantly simplified.

(3) A receiver circuit according to a third embodiment of the present invention includes, in the first embodiment, a delay value adjustment unit configured to adjust the delay time of the delay circuit based on the test result value so that each capture timing is the middle of a period of time during which the first or second state continues.

According to this embodiment, a receiver circuit can be provided in which the delay time of the delay circuit can be autonomously adjusted to reliably capture an input signal.

(4) In a receiver circuit according to a fourth embodiment of the present invention, in any of the first to third embodiments, the delay circuit changes at least one of a current drive ability of a delay element included in the delay circuit and the number of delay elements on a signal path of an output signal thereof.

According to this embodiment, in order to determine the optimum delay time, the delay time of the delay circuit can be changed in small units, and therefore, the optimum delay time can be more accurately determined.

(5) In a receiver circuit according to a fifth embodiment of the present invention, in any of the first to fourth embodiment, the data test circuit tests the latch signal at least one of a timing after initiation of an operation of the receiver circuit, a timing before start of displaying using the input signal, and a timing during a blanking interval of displaying using the input signal.

According to this embodiment, a receiver circuit which can receive a high-speed signal, taking a mounting factor into consideration, can be provided without affecting displaying and without providing a PLL circuit etc.

(6) A receiver circuit according to a sixth embodiment of the present invention includes, in any of the first to fifth embodiments, a first cross-point detection unit configured to, when it is determined based on the test result value that a period of time during which the first or second state continues is longer than a cycle of the capture timing, detect a deviation of a cross point of the input signal input as differential signals.

According to this embodiment, the cross point of a data signal can be adjusted. Therefore, in addition to the above advantages, a high-speed signal can be more correctly captured.

(7) A receiver circuit according to a seventh embodiment of the present invention includes, in any of the first to sixth embodiments, a second cross-point detection unit configured to, when it is determined based on the test result value that a period of time during which the first or second state continues when captured at a falling edge, rising edge, and falling edge of the capture clock signal in this order, is different from a period of time during which the first or second state continues when captured at a rising edge, falling edge, and rising edge of the capture clock signal in this order, detects a deviation of a cross point of the capture clock signal input as differential signals.

According to this embodiment, the cross point of a clock signal can be adjusted. Therefore, in addition to the above advantages, a high-speed signal can be more correctly captured.

(8) A receiver circuit according to an eighth embodiment of the present invention includes, in the seventh embodiment, a cross point adjustment unit configured to, when the second cross-point detection unit detects a deviation of a cross point of the capture clock signal, adjusts the cross point of the capture clock signal.

According to this embodiment, the cross point can be adjusted in the receiver circuit without controlling a transmitter circuit. Therefore, a high-speed signal can be more correctly captured using a simple configuration.

(9) A communication system according to a ninth embodiment of the present invention includes the receiver circuit according to any of the first to eighth embodiments, and a transmitter circuit configured to transmit the input signal to the receiver circuit.

According to this embodiment, a communication system can be provided which can receive a high-speed signal, taking a mounting factor into consideration, without providing a PLL circuit etc. in the receiver circuit.

(10) A communication system according to a tenth embodiment of the present invention includes the receiver circuit according to the sixth embodiment, and a transmitter circuit configured to transmit the input signal to the receiver circuit. The transmitter circuit, when the first cross-point detection unit detects a deviation of a cross point of the input signal, adjusts the cross point of the input signal.

According to this embodiment, a communication system can be provided which can more accurately receive a high-speed signal, taking a mounting factor into consideration, without providing a PLL circuit etc. in the receiver circuit.

(11) A communication system according to an eleventh embodiment of the present invention includes the receiver circuit according to the seventh embodiment, and a transmitter circuit configured to transmit the input signal to the receiver circuit. The transmitter circuit, when the second cross-point detection unit detects a deviation of a cross point of the capture clock signal, adjusts the cross point of the capture clock signal.

According to this embodiment, a communication system can be provided which can more accurately receive a high-speed signal, taking a mounting factor into consideration, without providing a PLL circuit etc. in the receiver circuit.

(12) An electronic device according to a twelfth embodiment of the present invention includes the communication system according to any of the ninth to eleventh embodiments.

According to this embodiment, an electronic device can be provided, at low cost, in which a high-speed signal can be more correctly received, and therefore, high-capacity and high-speed processing can be achieved.

(13) In a thirteenth embodiment of the present invention, a method for controlling a receiver circuit for capturing an input signal at a plurality of capture timings determined based on a capture clock signal, includes a delay control step of delaying the input signal changing to a first state or a second state by a set delay time, and outputting the delayed input signal, a latch step of capturing the input signal delayed by the delay control step at each capture timing, a data test step of testing a latch signal captured by the latch step, and a delay value adjustment step of adjusting the delay time based on a test result of the data test step. In the data test step, the latch signal captured at each capture timing is compared with an expected value.

According to this embodiment, by capturing a predetermined input signal while changing the delay time of the delay circuit, an optimum delay time can be determined. Therefore, if an input signal which is delayed by the determined optimum delay time is captured at a predetermined capture timing, highly accurate data reception can be achieved even in the case of a high-speed signal. As a result, highly accurate reception of a high-speed signal can be achieved using a simple configuration without providing a PLL circuit. Also, the delay time of an input signal can be adjusted, taking into consideration the timing tolerance values of transmitter and receiver circuits, mounting factors in a COF etc., fluctuations in inductance due to flexure of a COF etc., a difference between each flexure degree, etc. Moreover, for each input signal, the delay time can be adjusted, depending on individual variation factors, and therefore, the optimum delay time of the input signal can be determined and adjusted without being affected by a variation factor of another input signal having a small margin.

BRIEF DESCRIPTION OF DRAWINGS

FIG. 8 is a diagram showing latch signals captured by a data latch circuit in FIGS. 7(A) to 7(E).

FIG. 9 is a diagram showing example latch signals captured by the data latch circuit when an H-level time period of a data signal is shorter than ½ of the cycle of a capture clock.

FIG. 16 is a diagram showing example variation factors which have an influence on characteristics of an integrated circuit device, and example actual measurement values.

FIG. 17(A) is a diagram for describing an influence of a variation factor of FIG. 16 on characteristics of an integrated circuit device as a transmitter. FIG. 17(B) is a diagram for describing an influence of a variation factor of FIG. 16 on characteristics of an integrated circuit device as a receiver.

DESCRIPTION OF EMBODIMENTS

Embodiments of the present invention will now be described in detail with reference to the drawings. Note that the embodiments below are in no way intended to unduly limit the scope of the present invention as set forth in the claims. Not all components illustrated below are necessarily required to achieve the object of the present invention.

First Embodiment

Figure 1:
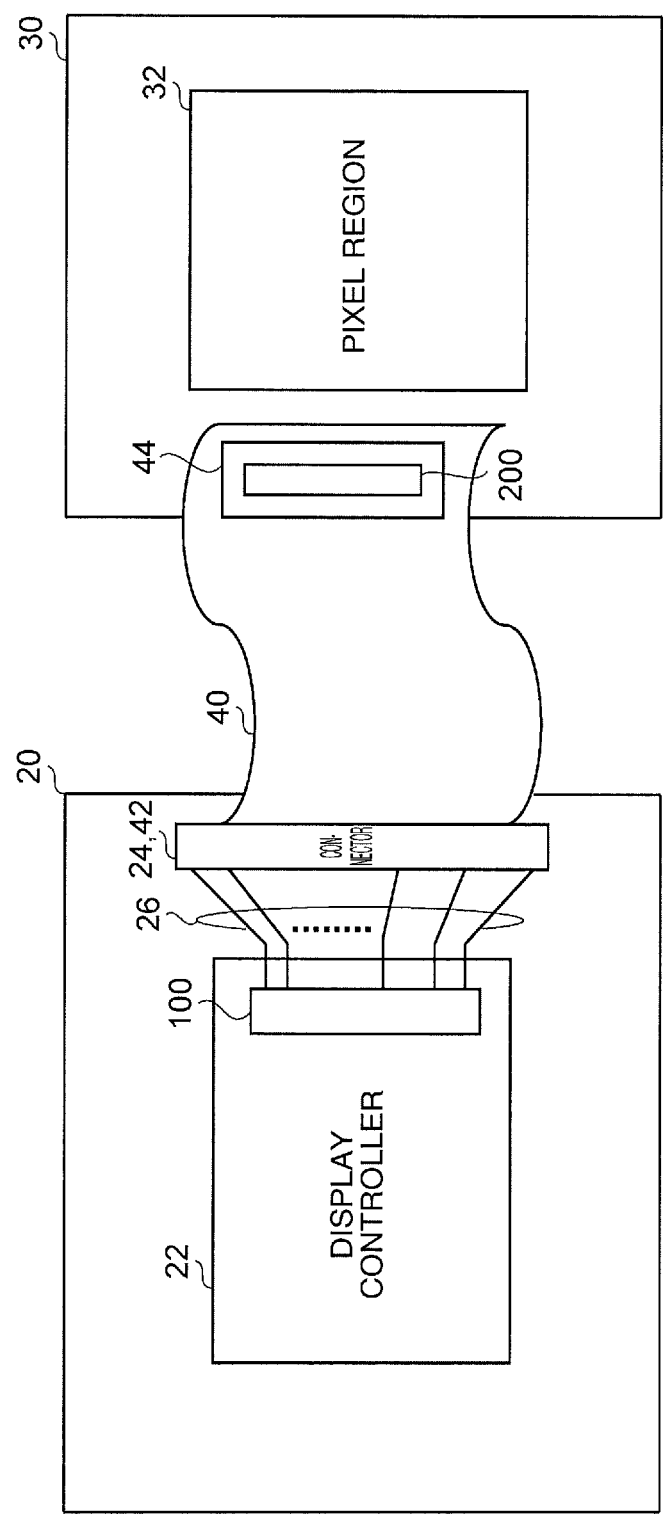
FIG. 1 is a diagram showing an example configuration of a display module mounted in a communication system in a first embodiment.

FIG. 1 shows an example configuration of a display module mounted in a communication system in a first embodiment of the present invention.

The display module 10 includes a PCB 20, a panel substrate 30, and a COF 40. On the PCB 20, a display controller 22 including a transmitter 100, and a connector 24, are mounted, and interconnects 26 which connect a connection portion of the display controller 22 and a connection portion of the connector 24 together are formed. On the panel substrate 30, a pixel region 32 in which a plurality of pixels are formed and arranged in a matrix, and interconnects for supplying a drive signal or a power supply voltage to the respective pixels are formed. On the COF 40, a connector 42 which is connected to the connector 24 of the PCB 20, and a display driver 44 including a receiver 200, are mounted, and interconnects which connect a connection portion of the connector 42 and a connection portion of the display driver 44 together are formed. Also, an output terminal of the display driver 44 is connected to interconnects formed on the panel substrate 30.

Note that, on the PCB 20, in addition to the display controller 22, a CPU (Central Processing Unit) which controls the display module 10, a memory, and other dedicated chips may be mounted. The transmitter 100 of the display controller 22 and the receiver 200 of the display driver 44 form a communication system.

The display controller 22 performs a predetermined image process on display data supplied from an image supply device (not shown), and supplies a data signal or a display timing signal corresponding to the image-processed display data to the display driver 44. The display driver 44 drives the pixels formed in the pixel region 32 via the interconnects formed on the panel substrate 30, based on the display data corresponding to the data signal, in synchronization with the display timing signal.

The data signal corresponding to the image-processed display data is transmitted by the transmitter 100 of the display controller 22, and is received by the receiver 200 of the display driver 44 through the interconnects 26, the connectors 24 and 42, and the interconnects of the COF 40. The transmitter 100 converts the display data into serial data, converts the serial data into data signals which are differential signals, and transmits the differential signals to the receiver 200, and also converts a clock signal into differential signals, and transmits the differential signals to the receiver 200. Also, the transmitter 100 can similarly transmit a display timing signal to the receiver 200.

The receiver 200 includes a delay circuit for each signal line. By capturing a particular signal transmitted by the transmitter 100 while changing the delay time of the delay circuit, an optimum delay time can be determined. Therefore, if a data signal from the transmitter 100 which is delayed by the determined optimum delay time is captured at a predetermined capture timing, highly accurate data reception can be achieved even in the case of a high-speed signal. In other words, the receiver 200 can capture a data signal which is invariably delayed by an optimum delay time, at a predetermined capture timing, and therefore, highly accurate reception of a high-speed signal can be achieved using a simple configuration without providing a PLL circuit.

Figure 2:
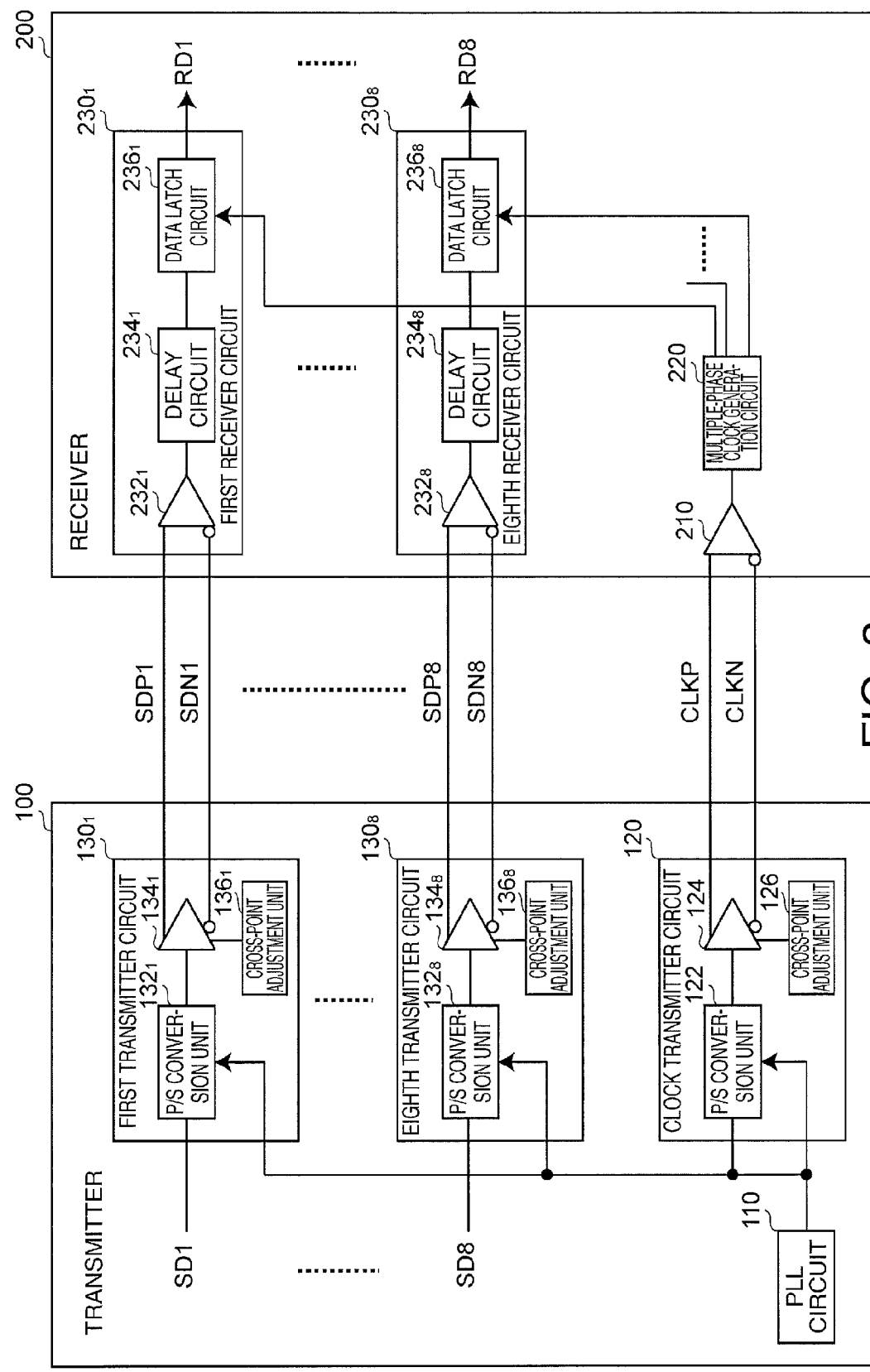
FIG. 2 is a diagram schematically showing an example configuration of a transmitter and a receiver of FIG. 1.

FIG. 2 schematically shows an example configuration of the transmitter 100 and the receiver 200 of FIG. 1. In FIG. 2, for the sake of convenience, it is assumed that a data signal and a clock signal are transmitted from the transmitter 100 to the receiver 200 through eight pairs of differential signal lines for data and a display timing signal and a pair of differential signal lines for clock.

The transmitter 100 includes a PLL circuit 110, a clock transmitter circuit 120, and a first to an eighth transmitter circuit $130_1$ to $130_8$. The clock transmitter circuit 120 is a transmitter circuit for transmitting a clock signal. The first to eighth transmitter circuits $130_1$ to $130_8$ are transmitter circuits for transmitting data and a display timing signal.

The PLL circuit 110 generates a transmission clock signal based on a reference clock (not shown), and supplies the transmission clock signal to the clock transmitter circuit 120, and the first to eighth transmitter circuits $130_1$ to $130_8$.

The clock transmitter circuit 120 includes a parallel-to-serial (hereinafter referred to as "P/S") conversion unit 122 and a differential transmitter 124. The P/S conversion unit 122 converts predetermined pattern data into serial data in which a transmission clock signal is incorporated into the predetermined pattern data, in synchronization with the transmission clock signal. The differential transmitter 124 generates a pair of differential signals corresponding to the serial data from the P/S conversion unit 122, and outputs the pair of differential signals through differential signal lines CLKP and CLKN to the receiver 200.

The clock transmitter circuit 120 and the first to eighth transmitter circuits $130_1$ to $130_8$ have the same configuration in order to reduce the skew of transmission timings to the extent possible. Therefore, the transmitter 100 divides transmission data including display data, a display timing signal, etc. into eight groups. The first to eighth transmitter circuits $130_1$ to $130_8$ each convert the corresponding group of transmission data into serial data, and transmit the data signal through a corresponding pair of differential signal lines to the receiver 200.

The first transmitter circuit (transmitter circuit in a broad sense) $130_1$ includes a P/S conversion unit $132_1$ and a differential transmitter $134_1$. The P/S conversion unit $132_1$ converts transmission data SD1 into serial data in synchronization with the transmission clock signal. The differential transmitter $134_1$ generates a pair of differential signals corresponding to the serial data from the P/S conversion unit $132_1$, and outputs the pair of differential signals through differential signal lines SDP1 and SDN1 to the receiver 200. For transmission data SD2 to SD8, the second to eighth transmitter circuits $130_2$ to $130_8$ similarly perform transmission through differential signal lines SDP2, SDN2, ..., SDP8, and SDN8 to the receiver 200. For example, the eighth transmitter circuit $130_8$ includes a P/S conversion unit $132_8$ and a differential transmitter $134_8$. The P/S conversion unit $132_8$ converts transmission data SD8 into serial data in synchronization with the transmission clock signal. The differential transmitter $134_8$ generates a pair of differential signals corresponding to the serial data from the P/S conversion unit $132_8$, and outputs the pair of differential signals through the differential signal lines SDP8 and SDN8 to the receiver 200.

Note that when a cross point of a pair of differential signals output by a differential transmitter is adjusted, each transmitter circuit can include a cross point adjustment unit corresponding to the differential transmitter. Specifically, the clock transmitter circuit 120 can include a cross point adjustment unit 126. The first transmitter circuit $130_1$ can include a cross point adjustment unit $136_1$ corresponding to the differential transmitter $134_1$. Similarly, the second to eighth transmitter circuits $130_2$ to $130_8$ can include the cross point adjustment units $136_1$ to $136_8$ corresponding to the differential transmitters $134_1$ to $134_8$. Each cross point adjustment unit controls a drive unit of the corresponding differential transmitter under the control of a CPU (not shown) mounted on the PCB 20, thereby driving a current drive ability to drive at least one of the pair of differential signals. As a result, the cross point of the pair of differential signals can be adjusted.

The receiver 200 includes a clock receiver 210, a multiple-phase clock generation circuit 220, and a first to an eighth receiver circuit $230_1$ to $230_8$.

The clock receiver 210 receives the differential signals which are transmitted from the differential transmitter 124 of the clock transmitter circuit 120 through the differential signal lines CLKP and CLKN. The multiple-phase clock generation circuit 220 extracts a clock signal from a reception signal received by the clock receiver 210 to generate multiple phase clock signals. Clock signals having different phases generated by the multiple-phase clock generation circuit 220 are supplied as capture clock signals to respective corresponding data latch circuits of the first to eighth receiver circuits $230_1$ to $230_8$.

The first receiver circuit (receiver circuit in a broad sense) $230_1$ includes a differential receiver $232_1$, a delay circuit $234_1$, and a data latch circuit (latch circuit in a broad sense) $236_1$. The differential receiver $232_1$ receives the differential signals which are transmitted by the differential transmitter $134_1$ of the first transmitter circuit $130_1$ through the differential signal lines SDP1 and SDN1. The delay circuit $234_1$ is configured so that the delay time can be adjusted. When receiving a data signal as an input signal from the differential receiver $232_1$, the delay circuit $234_1$ delays the data signal by the delay time set at that time, and outputs the resultant data signal to the data latch circuit $236_1$. The data latch circuit $236_1$ captures the output signal of the delay circuit $234_1$ at a plurality of capture timings which are determined based on one of the multiple phase clock signals generated by the multiple-phase clock generation circuit 220. The capture timing is, for example, a rising or falling edge of a clock signal. Reception data RD1 is output, corresponding to the latch signal captured by the data latch circuit $236_1$.

Similarly, the second to eighth receiver circuits $230_2$ to $230_8$ include the differential receivers $232_1$ to $232_8$, the delay circuits $234_1$ to $234_8$, and the data latch circuits $236_1$ to $236_8$. Each receiver circuit receives a differential signal transmitted from a corresponding transmitter circuit, delays the differential signal using the delay circuit, and holds the differential signal using the data latch circuit. For example, the eighth receiver circuit $230_8$ includes a differential receiver $232_8$, a delay circuit $234_8$, and a data latch circuit $236_8$. The differential receiver $232_8$ receives differential signals which are transmitted by the differential transmitter $134_8$ of the eighth transmitter circuit $130_8$ through the differential signal lines $SDP_8$ and $SDN_8$. The delay circuit $234_8$ is configured so that the delay time can be adjusted. When receiving a data signal from the differential receiver $232_8$ as an input signal, the delay circuit $234_8$ delays the data signal by a delay time set at the time, and outputs the resultant signal to the data latch circuit $236_8$. The data latch circuit $236_8$ captures the output signal of the delay circuit $234_8$ at a plurality of capture timings which are determined based on one of the multiple-phase clock signals generated by the multiple-phase clock generation circuit $220$. Reception data RD8 is output, corresponding to the latch signal captured by the data latch circuit $236_8$.

The reception data RD1 to RD8 output from the first to eighth receiver circuits $230_1$ to $230_8$ is converted into, for example, parallel data, which is then used as display data or a display timing signal in the display driver 44.

A detailed configuration of the first receiver circuit $230_1$ will now be described. Detailed configurations of the second to eighth receiver circuits $230_2$ to $230_8$ which are similar to that of the first receiver circuit $230_1$ will not be described.

Figure 3:
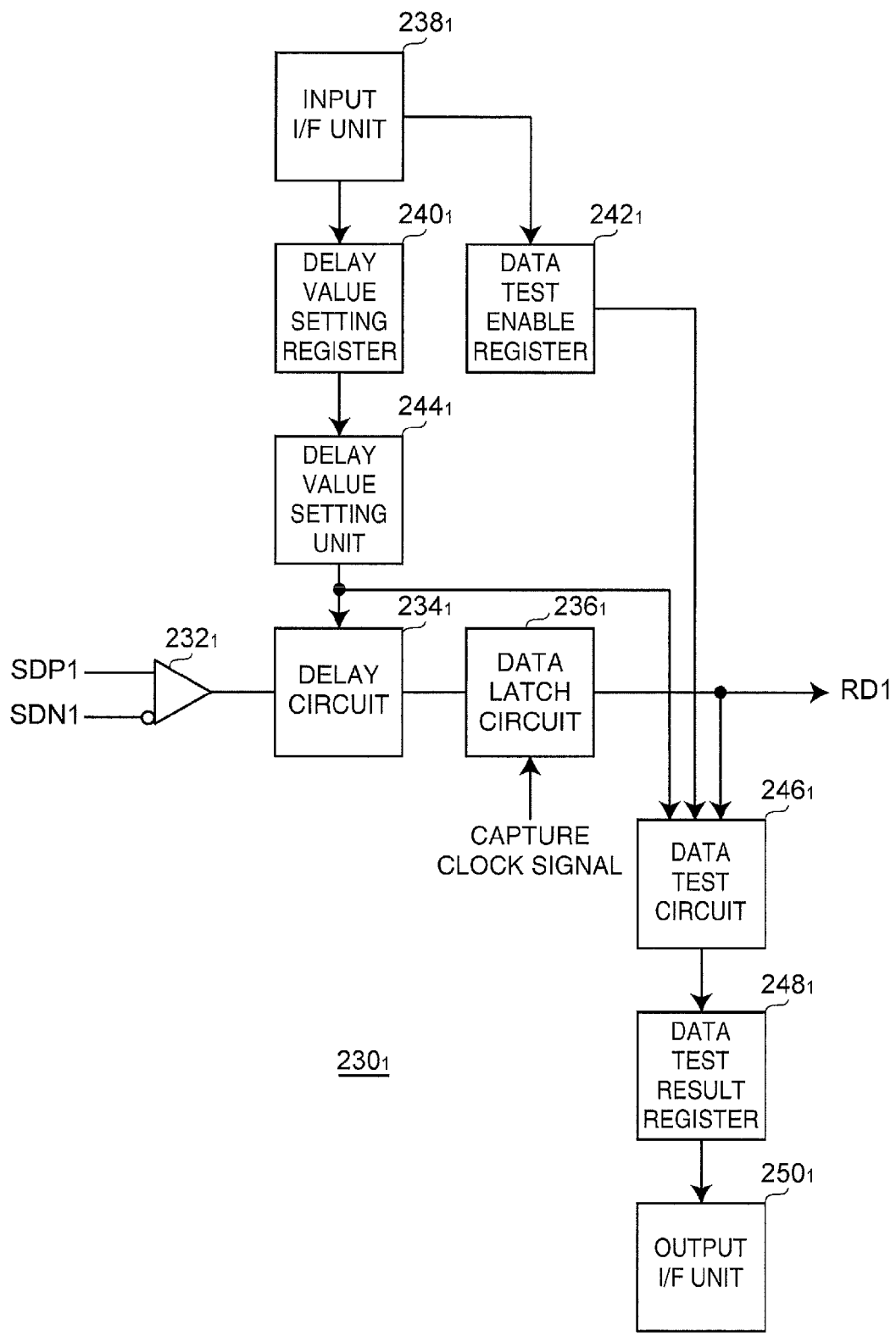
FIG. 3 is a block diagram of a detailed example configuration of a first receiver circuit.

FIG. 3 shows a block diagram of a detailed example configuration of the first receiver circuit $230_1$. In FIG. 3, parts similar to those of FIG. 2 are indicated by the same reference characters and will not be redundantly described.

The first receiver circuit $230_1$ includes, in addition to the differential receiver $232_1$, the delay circuit $234_1$, and the data latch circuit $236_1$ of FIG. 2, an input interface (hereinafter referred to as "I/F") unit $238_1$ and a delay value setting register $240_1$. Moreover, the first receiver circuit $230_1$ includes a data test enable register $242_1$, a delay value setting unit $244_1$, a data test circuit $246_1$, a data test result register $248_1$, and an output I/F unit $250_1$. Note that the functionalities of the input I/F unit $238_1$ and the output I/F unit $250_1$ may be implemented by a single I/F unit.

The input I/F unit $238_1$ performs an input interface process when the CPU (not shown) accesses the delay value setting register $240_1$ and the data test enable register $242_1$.

The delay value setting register $240_1$ is a register which is configured to be able to be accessed by the CPU via the input I/F unit $238_1$. A set value corresponding to a delay value is set into the delay value setting register $240_1$ by the CPU.

The data test enable register $242_1$ is a register which is configured to be able to be accessed by the CPU via the input I/F unit $238_1$, and in which a data test process is set to be in the enabled state by being accessed by the CPU. The data test process is performed on a data signal which is transmitted by the first transmitter circuit $130_1$ and changes to an H level (first state) or an L level (second state) according to a predetermined pattern.

The delay value setting unit $244_1$ sets the delay time of the delay circuit $234_1$ based on the set value set in the delay value setting register $240_1$.

The delay circuit $234_1$ delays a data signal received by the differential receiver $232_1$ by a delay time corresponding to the set value set in the delay value setting register $240_1$, and outputs the resultant data signal. The delay circuit $234_1$, which includes one or a plurality of delay elements, changes at least one of the current drive ability of the delay element and the number of delay elements on a signal path of the output signal based on the set value set in the delay value setting register $240_1$.

The capture clock signal has been input to the data latch circuit $236_1$. The data latch circuit $236_1$ captures the data signal delayed by the delay circuit $234_1$ at a plurality of capture timings determined based on the capture clock signal, and outputs the data signal as the reception data RD1.

The data test circuit $246_1$ tests the latch signal captured in the data latch circuit $236_1$. The data test circuit $246_1$ compares latch signals which are data signals captured at capture timings during a predetermined period of time with a predetermined expected value, associates the result of the comparison with a corresponding set value (delay value), and outputs the resultant value as a test result value.

The test result value from the data test circuit $246_1$ is set into the data test result register $248_1$. The data test result register $248_1$ is a register which is configured to be able to be accessed by the CPU via the output I/F unit $250_1$, and from which the test result value is read by the CPU.

The output I/F unit $250_1$ performs an output interface process when the CPU accesses the data test result register $248_1$.

Figure 4:
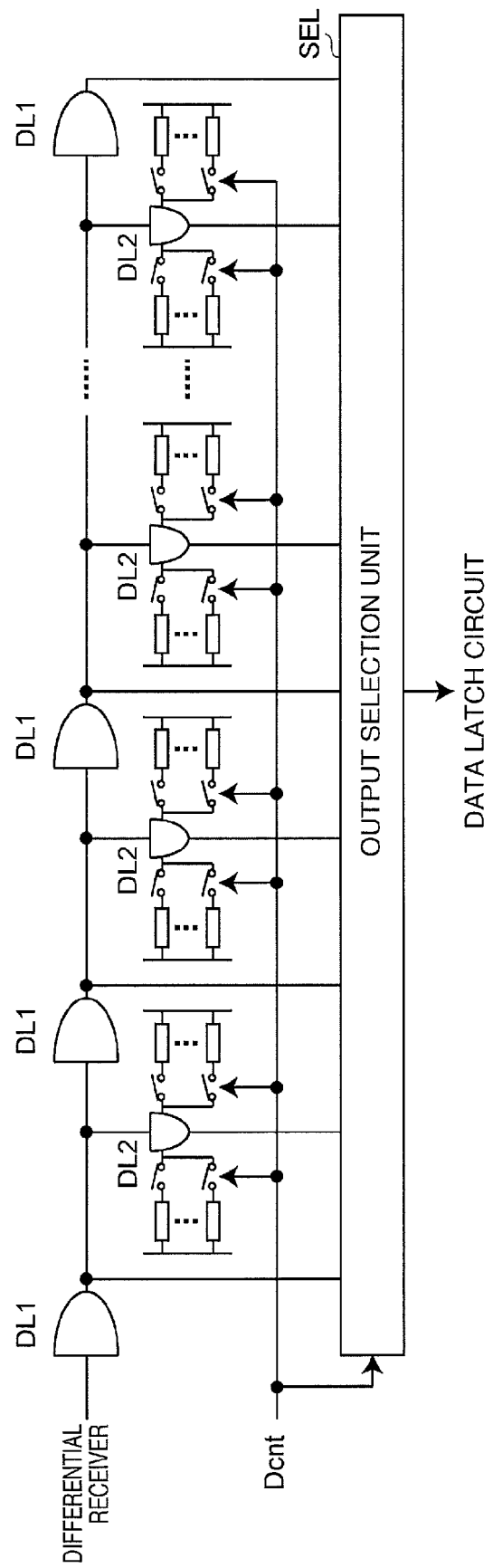
FIG. 4 is a diagram showing an example configuration of a delay circuit of FIG. 3.

FIG. 4 shows an example configuration of the delay circuit $234_1$ of FIG. 3.

The delay circuit $234_1$ includes a plurality of first delay elements DL1, a plurality of second delay elements DL2, and an output selection unit SEL. The plurality of first delay elements DL1 are connected in series. A data signal from the differential receiver $232_1$ is input to the input of a first delay element DL1 of the first stage, and the output of each first delay element DL1 is connected to the output selection unit SEL. Also, the output of each first delay element DL1 is connected through the corresponding second delay element DL2 to the output selection unit SEL.

The second delay element DL2 is connected to a high-potential power supply through one of a plurality of resistance elements having different resistance values so that the delay time of the rise of the output signal thereof can be adjusted. Also, the second delay element DL2 is connected to a low-potential power supply through one of a plurality of resistance elements having different resistance values so that the delay time of the fall of the output signal thereof can be adjusted.

The delay value setting unit $244_1$ outputs a control signal Dcnt corresponding to the set value set in the delay value setting register $240_1$ to the plurality of the second delay elements DL2 and the output selection unit SEL. Each second delay element DL2 is connected through a resistance element selected based on the control signal Dcnt to the high-potential and low-potential power supplies. The output selection unit SEL selects, based on the control signal Dcnt, one of the outputs of the plurality of first delay elements DL1 and the outputs of the plurality of the second delay elements DL2, and outputs a signal passed through the selected path, as an output signal, to the data latch circuit $236_1$.

Therefore, the delay circuit $234_1$ can change at least one of the current drive ability of the delay element and the number of delay elements on the signal path of the output signal based on the set value set in the delay value setting register $240_1$.

In the first receiver circuit $230_1$ of the first embodiment, the CPU repeatedly performs setting while shifting the delay time of the delay circuit $234_1$. Every time performing setting, the first receiver circuit $230_1$ performs a data test after capturing an input data signal. The CPU calculates an optimum delay value based on the results of these data tests.

Figure 5:
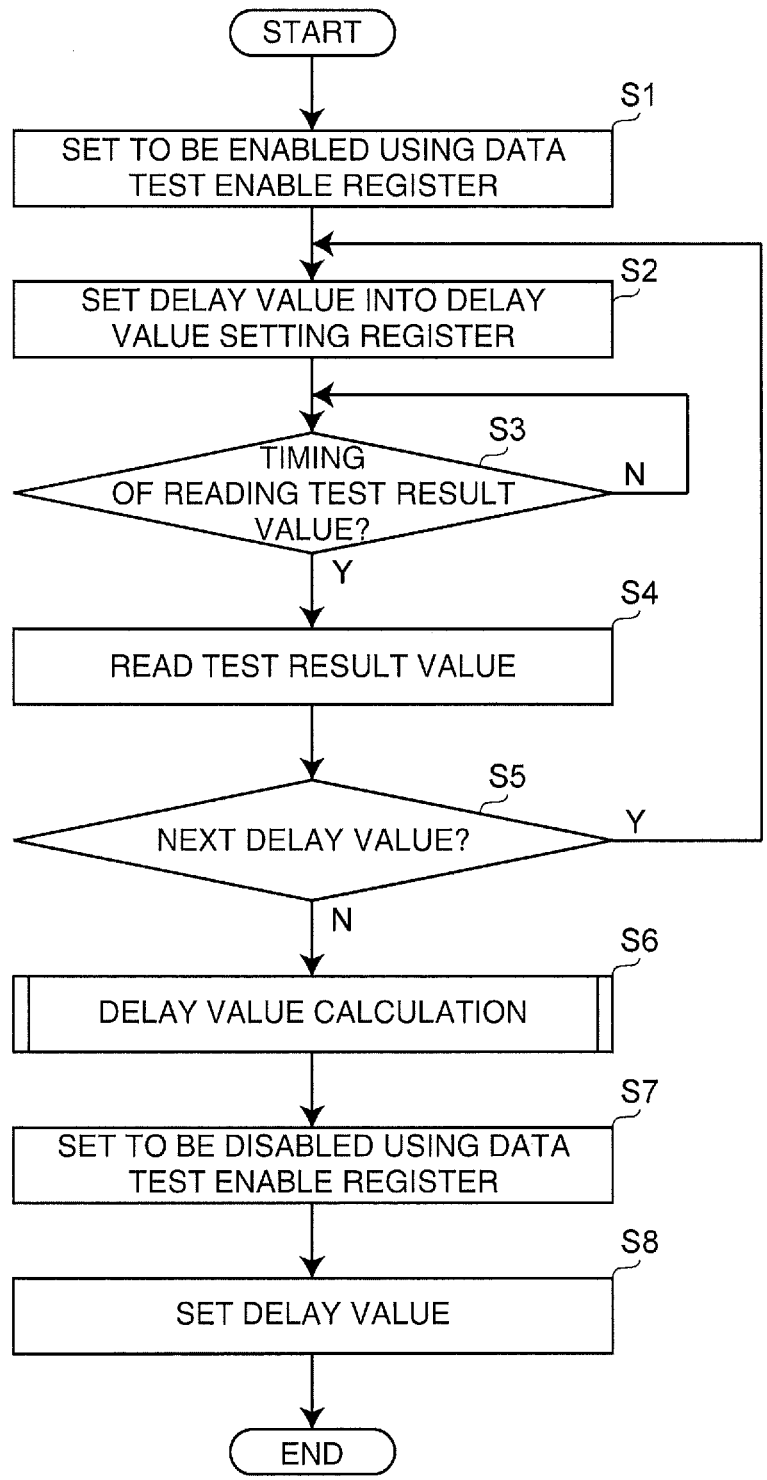
FIG. 5 is a flowchart of an example control of the first receiver circuit of the first embodiment.
Figure 6:
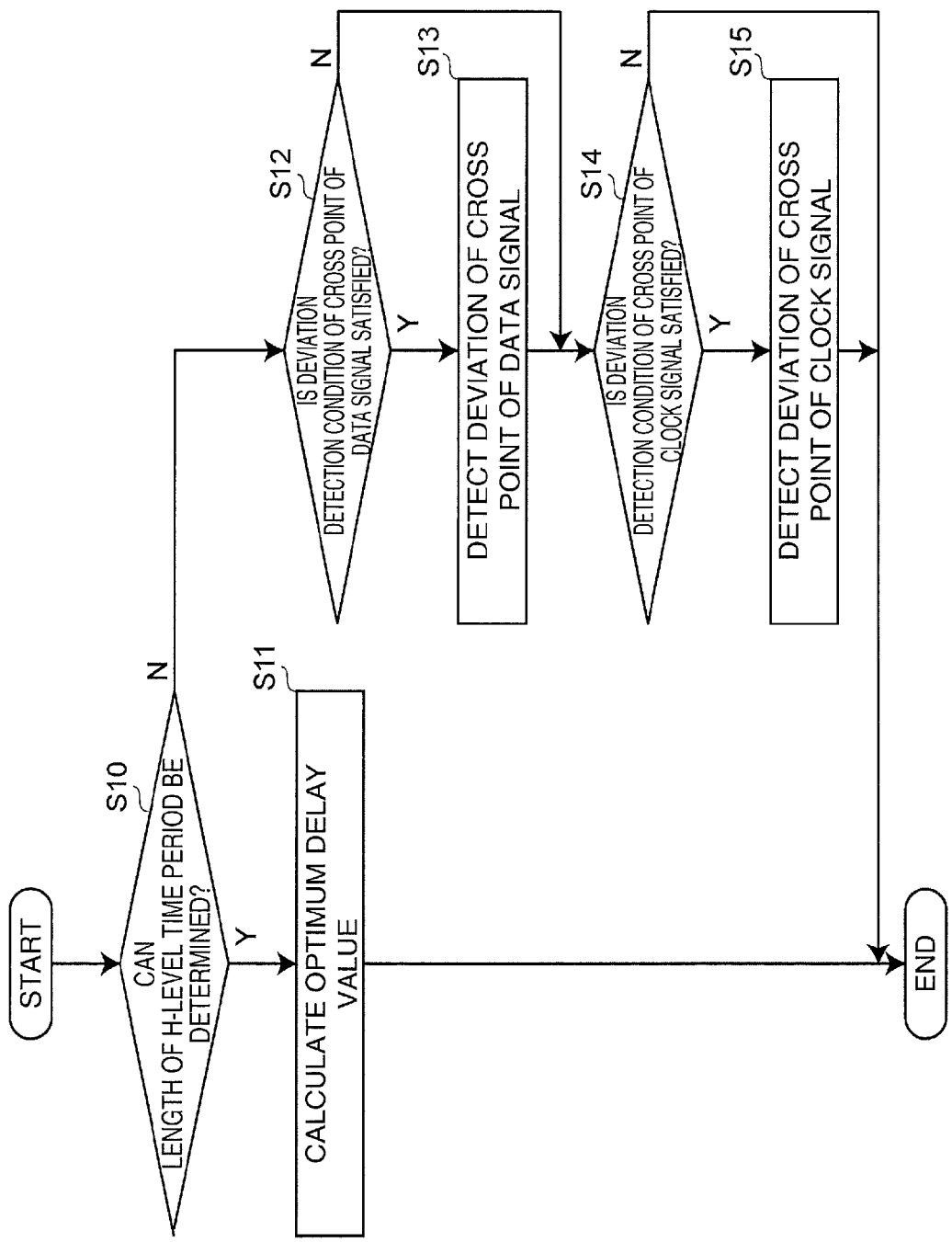
FIG. 6 is a flowchart of an example control of the first receiver circuit of the first embodiment.

FIGS. 5 and 6 show flow diagrams of an example control of the first receiver circuit $230_1$ of the first embodiment. FIG. 5 shows an example control of the CPU which controls the first receiver circuit $230_1$. FIG. 6 shows a detailed example process in step S6 of FIG. 5. For example, a memory (not shown) stores programs corresponding to respective steps of FIGS. 5 and 6. The CPU executes a process corresponding to a program read from the memory.

Initially, the CPU accesses the data test enable register $242_1$ to set the data test process to the enabled state (step S1).

Next, the CPU sets a set value corresponding to a delay value into the delay value setting register $240_1$ (step S2). As a result, in the first receiver circuit $230_1$, the delay value setting unit $244_1$ sets the delay time of the delay circuit $234_1$ based on the set value set in step S2. Thereafter, during a predetermined period of time, the first transmitter circuit $130_1$ transmits a predetermined data signal to the first receiver circuit $230_1$, and the first receiver circuit $230_1$ delays a data signal by the set delay time before capturing the data signal into the data latch circuit $236_1$. During the above period of time, under the same conditions, the data signal is desirably repeatedly delayed and captured into the data latch circuit $236_1$.

After step S2, the CPU waits until the read timing of the data test result register $248_1$ (step S3: N). Thereafter, at the read timing, the CPU accesses the data test result register $248_1$ to read the test result value which is a value registered in the data test result register $248_1$ (step S4).

When a data test is performed using the next delay value (step S5: Y), the CPU sets a set value corresponding to the next delay value into the delay value setting register $240_1$ (step S2).

In step S5, when the next data test is not performed (step S5: N), the CPU calculates an optimum delay value based on a plurality of test result values read in step S4 (step S6).

In step S6, as shown in FIG. 6, the CPU determines, based on a plurality of test result values for different delay times, whether or not the length of a period of time during which a plurality of latch signals at capture timings are successively at the H level can be determined (step S10). If the result of the determination is positive (step S10: Y), the CPU calculates an optimum delay value based on the test result value (step S11, END). For example, when a plurality of latch signals change from the L level to the H level before returning to the L level, then if the length of the period of time during which the plurality of latch signals are successively at the H level can be determined, a delay value in the vicinity of the middle of the H-level time period is calculated as the optimum delay value.

If the result of the determination in step S10 is negative (step S10: N), the CPU determines, based on the test result value, whether or not a deviation detection condition of a cross point of a data signal transmitted as differential signals is satisfied (step S12).

If the deviation detection condition of the cross point of the data signal is satisfied (step S12: Y), the CPU detects this state as a deviation of the cross point of the data signal (step S13). For example, if, in step S13, the deviation of the cross point of the data signal is detected, it is desirable to adjust the cross point by the cross point adjustment unit $136_1$ of the first transmitter circuit $130_1$.

If it is not determined in step S12 that the deviation detection condition of the cross point of the data signal is satisfied (step S12: N), or following step S13, the CPU executes step S14. In step S14, the CPU determines, based on the test result value, whether or not the deviation detection condition of a cross point of a clock signal transmitted as a differential signal is satisfied.

If it is determined that the deviation detection condition of the cross point of the clock signal is satisfied (step S14: Y), the CPU detects this state as a deviation of the cross point of the clock signal (step S15). For example, if, in step S15, the deviation of the cross point of the clock signal is detected, it is desirable to adjust the cross point by the cross point adjustment unit 126 of the clock transmitter circuit 120.

If it is not determined in step S14 that the deviation detection condition of the cross point of the clock signal is satisfied (step S14: N), or following step S15, the CPU executes step S7. In step S7, the CPU accesses the data test enable register $242_1$ to set the data test process to the disabled state.

Thereafter, the CPU sets, into the delay value setting register $240_1$, a set value corresponding to a delay value obtained as a result of calculation in step S6 (step S8), and ends the series of processes (END).

As described above, the first receiver circuit $230_1$ delays a data signal which changes in a particular pattern, by a set delay time, and outputs the resultant data signal (delay control step), and captures the delayed data signal at each capture timing (latch step). Thereafter, the first receiver circuit $230_1$ tests the captured latch signal (data test step), and based on the result of the test, the CPU adjusts the delay time of the delay circuit (delay value adjustment step).

As a result, in the first receiver circuit $230_1$, the delay value setting unit $244_1$ sets the delay time of the delay circuit $234_1$ based on the set value set in step S8. Therefore, a data signal transmitted from the first transmitter circuit $130_1$ to the first receiver circuit $230_1$ can be reliably captured.

FIGS. 7(A) to 7(E) show diagrams for describing an operation of the first receiver circuit $230_1$. FIGS. 7(A) to 7(E) show example timing waveforms of data signals D having different delay times with respect to a capture clock signal CLK. Note that FIGS. 7(A) to 7(E) show the data signals D which are pulse signals which change to the H level, where a period of time during which the data signal D is at the H level is longer than ½ of the cycle of the capture clock signal CLK.

Figure 7A:
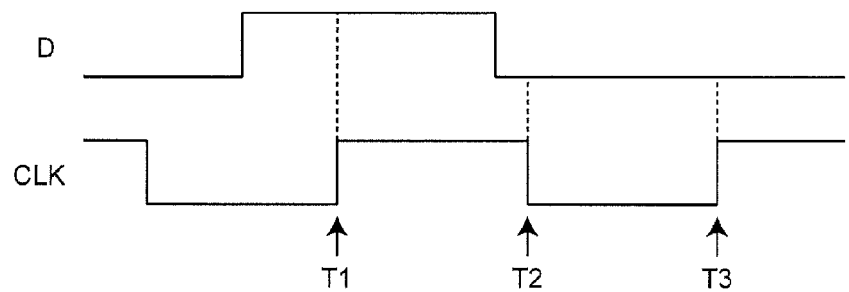
FIGS. 7(A) to 7(E) are diagrams for describing an operation of the first receiver circuit.
Figure 7B:
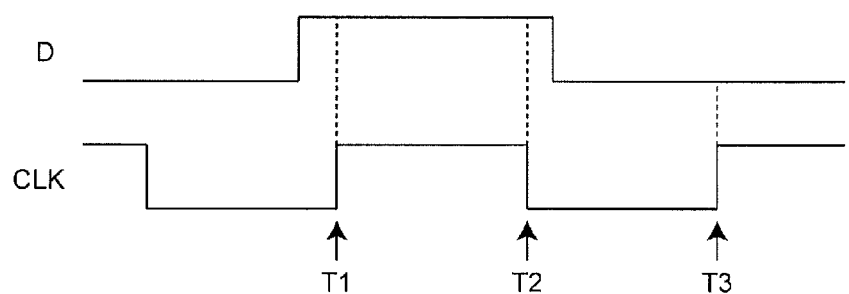
Figure 7C:
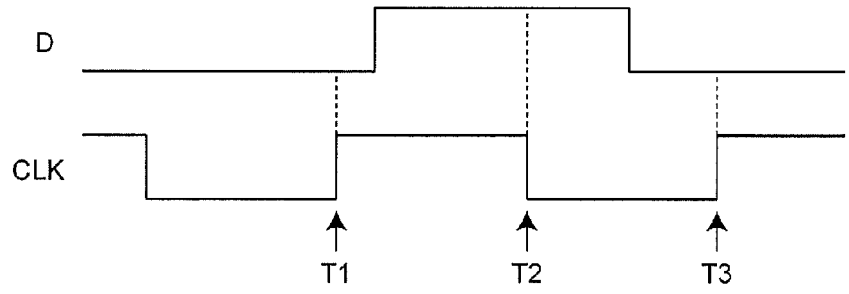
Figure 7D:
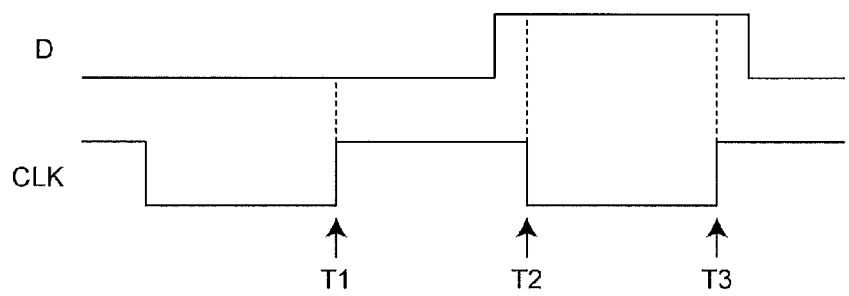
Figure 7E:
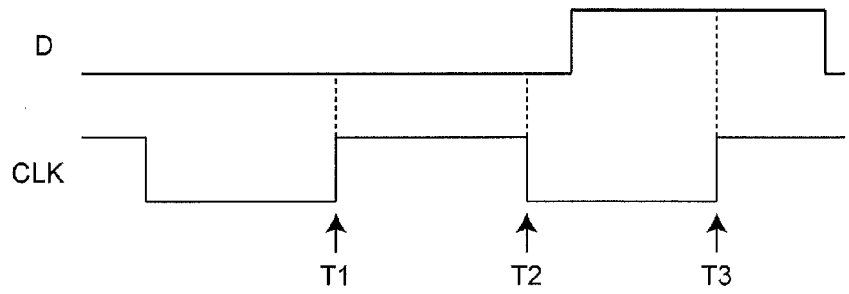

FIG. 7(A) shows example timing waveforms of the data signal D and the capture clock signal CLK with respect to a delay time DT1. FIG. 7(B) shows example timing waveforms of the data signal D and the capture clock signal CLK with respect to a delay time DT2 (DT2>DT1). FIG. 7(C) shows example timing waveforms of the data signal D and the capture clock signal CLK with respect to a delay time DT3 (DT3>DT2). FIG. 7(D) shows example timing waveforms of the data signal D and the capture clock signal CLK with respect to a delay time DT4 (DT4>DT3). FIG. 7(E) shows example timing waveforms of the data signal D and the capture clock signal CLK with respect to a delay time DT5 (DT5>DT4).

Here, it is assumed that the capture timings are the rising and falling edges of the capture clock signal CLK. In the case of the delay time DT1, the data latch circuit $236_1$ captures the H level at a capture timing T1, the L level at a capture timing T2, and the L level at a capture timing T3.

Moreover, when the delay time is changed to the delay time DT2, the data latch circuit $236_1$ captures the H level at the capture timing T1, the H level at the capture timing T2, and the L level at the capture timing T3. Similarly, with respect to the delay time DT3, the data latch circuit $236_1$ captures the L level at the capture timing T1, the H level at the capture timing T2, and the L level at the capture timing T3. In the case of the delay time DT4, the data latch circuit $236_1$ captures the L level at the capture timing T1, the H level at the capture timing T2, and the H level at the capture timing T3. In the case of the delay time DT5, the data latch circuit $236_1$ captures the L level at the capture timing T1, the L level at the capture timing T2, and the H level at the capture timing T3.

The data test circuit $246_1$ tests a latch signal captured at each capture timing. Actually, as shown in FIGS. 7(A) to 7(E), the level captured by the data latch circuit $236_1$ at each capture timing is not fixed to the H or L level. Specifically, even if a signal is captured in the case of the same delay value and at the same capture timing, the captured level may be the H level in one occasion and the L level in another occasion. At each capture timing, the data test circuit $246_1$ outputs the result of comparison of a latch signal at the capture timing with the expected value, as the result of the data test. For example, when, as a result of the data test, a data signal is repeatedly captured under the same conditions, the case where all of the data signals match the expected value at the capture timings, the case where none of the data signals matches the expected value at the capture timings, and the case where some of the data signals match the expected value and the other data signals do not match the expected value at the capture timings, can be tested. Such a data test result of the data test circuit $246_1$ is set as a test result value into the data test result register $248_1$.

FIG. 8 shows latch signals captured by the data latch circuit $236_1$ in FIGS. 7(A) to 7(E).

If attention is paid to the capture timing T1 and the delay times DT1 to DT5 are successively shifted, the data latch circuit $236_1$ captures the H, H, L, L, and L levels. If attention is paid to the capture timing T2 and the delay times DT1 to DT5 are successively shifted, the data latch circuit $236_1$ captures the L, H, H, H, and L levels. Similarly, if attention is paid to the capture timing T3 and the delay times DT1 to DT5 are successively shifted, the data latch circuit $236_1$ captures the L, L, L, H, and H levels.

Therefore, if attention is paid to the capture timing T2, a period of time during which the data signal D is at the H level can be found out, and therefore, the optimum delay value of the data signal D can be obtained. In this case, the optimum delay time DLx has an intermediate value between the delay times DT2 and DT4. Therefore, the CPU calculates, for example, (d2+d4)/2 as the optimum delay value dx in step S11 of FIG. 5, where d2 represents a delay value corresponding to the delay time DT2, and d4 represents a delay value corresponding to the delay time DT4. Thereafter, the CPU sets a set value corresponding to the delay value dx into the delay value setting register $240_1$. As a result, the first receiver circuit $230_1$ reliably captures a data signal from the first transmitter circuit $130_1$.

In contrast to this, if the H-level time period of the data signal D is shorter than ½ of the cycle of the capture clock signal CLK, the CPU performs the following process.

FIG. 9 shows example latch signals captured by the data latch circuit $236_1$ when the H-level time period of the data signal D is shorter than ½ of the cycle of the capture clock signal CLK. Note that FIG. 9 shows example signal levels with respect to the delay times DT1 to DT7, for example.

In the example of FIG. 9, the H-level time period of the data signal D cannot be determined based on the results of the signal levels at the capture timings with respect to the delay times DT2 and DT6. In this case, it is determined that this means that the cross point of the differential signal deviates, and therefore, the CPU detects this state as a deviation of the cross point of the data signal or the capture clock signal.

Specifically, in step S12 of FIG. 6, if it is determined that a period of time during which the H or L level continues is longer than the cycle of the capture timing, it is determined that the deviation detection condition of the cross point of the data signal is satisfied. Also, in step S14 of FIG. 6, if it is determined that a period of time during which the H or L level continues when captured at the falling, rising, and falling edges of the capture clock signal in this order, is different from a period of time during which the H or L level continues when captured at the rising, falling, and rising edges of the capture clock signal in this order, it is determined that the deviation detection condition of the cross point of the clock signal is satisfied.

Note that the timing at which the data test of the data test circuit $246_1$ etc. is performed is desirably at least one of a timing after initiation of the operation of the first receiver circuit $230_1$, a timing before the start of displaying using a data signal, and a timing during the blanking interval of displaying using a data signal. In this case, a receiver circuit which can receive a high-speed signal, taking a mounting factor into consideration, can be provided without affecting displaying and without providing a PLL circuit etc.

As described above, according to the first embodiment, while the delay time of a data signal from each transmitter circuit is shifted, an optimum delay time is determined in a corresponding receiver circuit, and thereafter, the data signal can be captured at the optimum delay time. As a result, the receiver circuit can capture a high-speed signal without providing a PLL circuit. Also, the delay time of a data signal can be adjusted, taking into consideration the timing tolerance values of transmitter and receiver circuits, mounting factors in a COF etc., fluctuations in inductance due to flexure of a COF etc., a difference between each flexure degree, etc. Moreover, for each data signal, the delay time can be adjusted, depending on individual variation factors, and therefore, the optimum delay time of the data signal can be determined and adjusted without being affected by a variation factor of another data signal having a small margin.

Second Embodiment

The first embodiment has been described, assuming that the CPU accesses the first receiver circuit $230_1$ and determines the optimum delay time. The present invention is not limited to this. In a second embodiment, a receiver circuit autonomously determines the optimum delay time.

Figure 10:
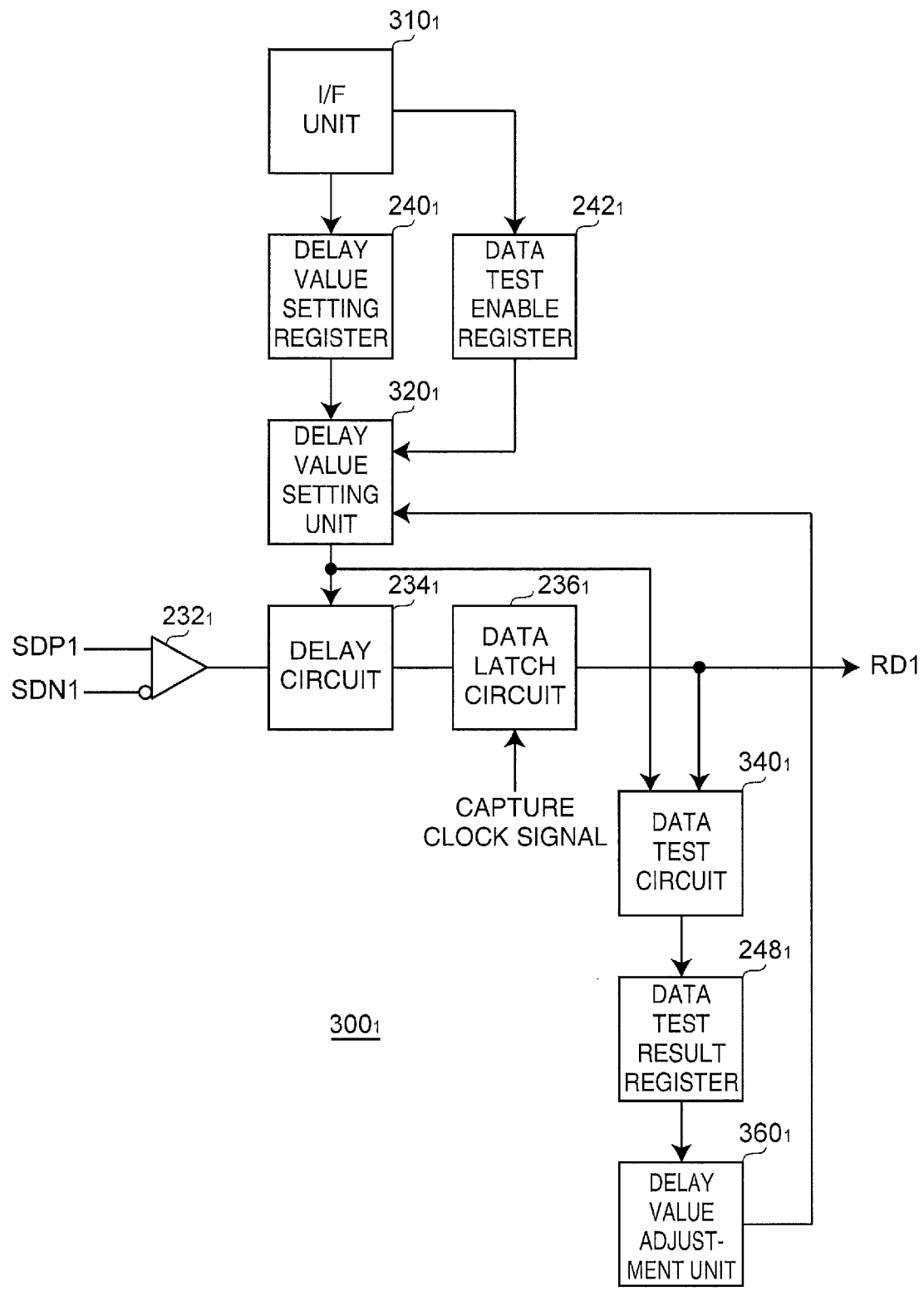
FIG. 10 is a block diagram of an example configuration of a first receiver circuit in a second embodiment.

FIG. 10 shows a block diagram of an example configuration of a first receiver circuit in the second embodiment. In FIG. 10, parts similar to those of FIG. 3 are indicated by the same reference characters and will not be redundantly described.

The first receiver circuit $300_1$ in the second embodiment is provided in the receiver 200, instead of the first receiver circuit $230_1$ of FIG. 2. In this case, a second to an eighth receiver circuit $230_2$ to $230_8$ having a configuration similar to that of the first receiver circuit $300_1$ are provided instead of the second to eighth receiver circuits $230_2$ to $230_8$.

The first receiver circuit $300_1$ includes, in addition to the differential receiver $232_1$, the delay circuit $234_1$, and the data latch circuit $236_1$, an I/F unit $310_1$, a delay value setting register $240_1$, a data test enable register $242_1$, and a delay value setting unit $320_1$. Also, the first receiver circuit $300_1$ includes a data test circuit $340_1$, a data test result register $248_1$, and a delay value adjustment unit $360_1$.

The I/F unit $310_1$ performs an input interface process when the CPU (not shown) accesses the delay value setting register $240_1$ and the data test enable register $242_1$.

The delay value setting unit $320_1$, when the data test process is in the enabled state, performs a control to change the delay time of the delay circuit $234_1$ while updating the delay value. Also, the delay value setting unit $320_1$, when the data test process is in the disabled state, sets the delay circuit $234_1$ to have a delay time corresponding to the set value set in the delay value setting register $240_1$.

The data test circuit $340_1$ performs a data test based on a signal which has been delayed by each of a plurality of delay times and repeatedly captured at each capture timing in the data latch circuit $236_1$.

The delay value adjustment unit $360_1$ calculates an optimum delay value based on the test result value set in the data test result register $248_1$, and outputs the optimum delay value to the delay value setting unit $320_1$. The delay value adjustment unit $360_1$ sets, based on the test result value, the set value into the delay value setting register $240_1$ so that the capture timing is put at the middle of a period of time during which the H or L level continues. Also, the delay value adjustment unit $360_1$ may set, based on the test result value, a set value into the delay value setting register $240_1$ so that a latch pattern corresponding to latch signals captured at capture timings with respect to each of different delay times set in the delay circuit $234_1$ matches a predetermined first pattern.

Figure 11:
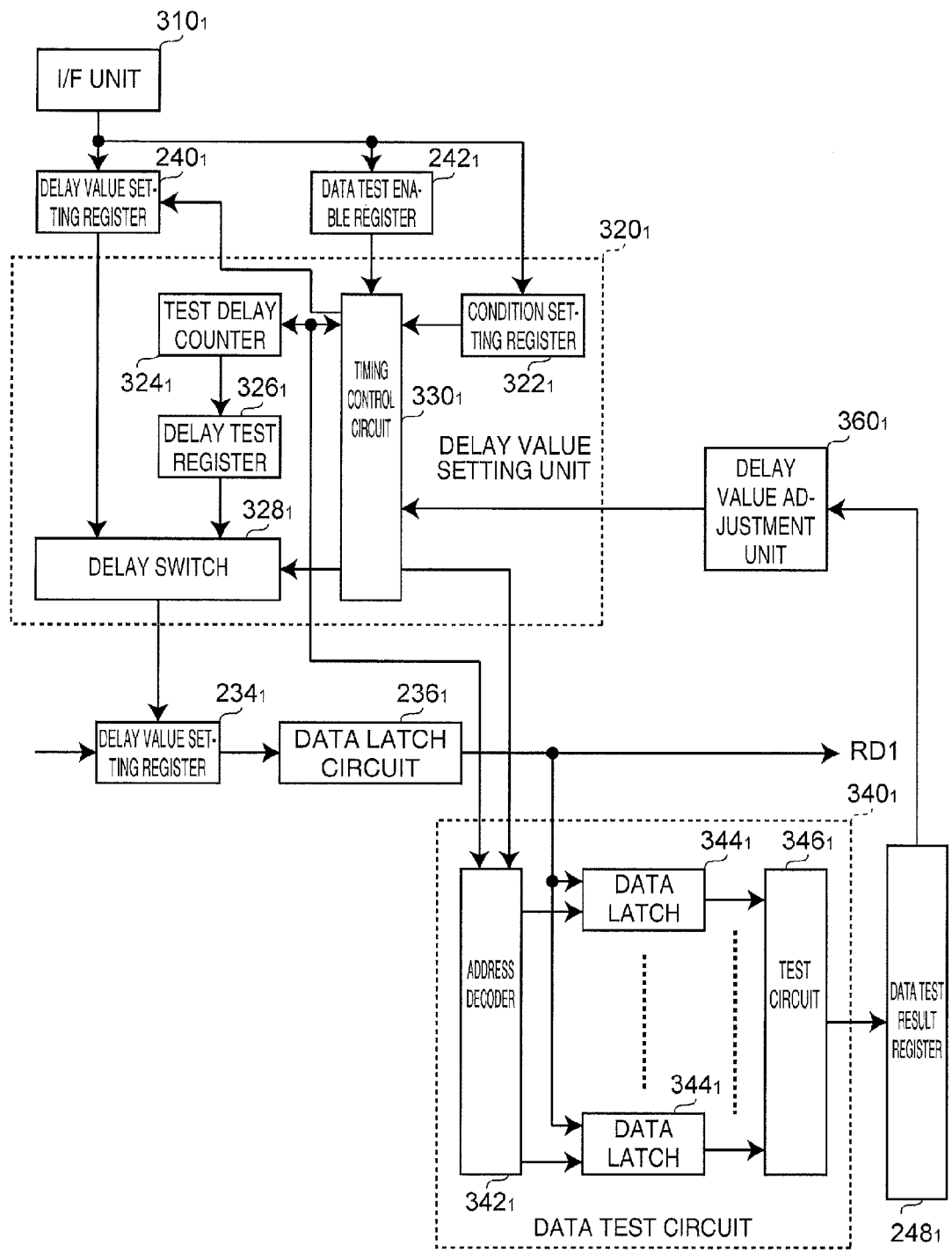
FIG. 11 is a diagram showing a detailed example configuration of the first receiver circuit of FIG. 10.

FIG. 11 shows a detailed example configuration of the first receiver circuit $300_1$ of FIG. 10. In FIG. 11, parts similar to those of FIG. 10 are indicated by the same reference characters and will not be redundantly described.

The delay value setting unit $320_1$ includes a condition setting register $322_1$, a test delay counter $324_1$, a delay test register $326_1$, a delay switch $328_1$, and a timing control circuit $330_1$.

The CPU sets a set value corresponding to conditions for a data test into the condition setting register $322_1$ via the I/F unit $310_1$. The conditions for a data test include the range of a delay time for the data test, the updating unit of a delay time, etc.

The test delay counter $324_1$ is a counter which updates a delay value when a data test is set to be in the enabled state. The delay value updated by the test delay counter $324_1$ is set into the delay test register $326_1$.

The delay switch $328_1$, when the data test process is set to be in the enabled state, sets the delay time of the delay circuit $234_1$ based on the delay value set in the delay test register $326_1$. Also, the delay switch $328_1$, when the data test process is set to be in the disabled state, sets the delay time of the delay circuit $234_1$ based on the delay value set in the delay value setting register $240_1$.

The timing control circuit $330_1$ controls each part of the delay value setting unit $320_1$. The timing control circuit $330_1$, when receiving an optimum delay value from the delay value adjustment unit $360_1$, sets a set value corresponding to the delay value into the delay value setting register $240_1$. Thereafter, the timing control circuit $330_1$ switches the delay switch $328_1$ to set the delay circuit $234_1$ to have an optimum delay time.

The data test circuit $340_1$ includes an address decoder $342_1$, a plurality of data latches $344_1$, and a test circuit $346_1$. There are as many data latches $344_1$ as there are delay values (delay times) which are updated when the data test process is performed. The address decoder $342_1$ selects a data latch $344_1$ corresponding to a delay value updated by the test delay counter $324_1$. The selected data latch $344_1$ latches latch signals of the data latch circuit $236_1$ captured at capture timings for each delay value updated by the test delay counter $324_1$. The test circuit $346_1$ compares, for each delay value (delay time), the latch signals captured at the capture timings with an expected value, and outputs the result of the comparison as a test result. The test result obtained by the test circuit $346_1$ is set into the data test result register $248_1$. As a result, for example, the latch pattern at the capture timing T2 of FIG. 8 is obtained as the test result, and a period of time during which the H level continues can be determined based on the test result.

When the delay value adjustment unit $360_1$ sets, based on the test result value, a set value into the delay value setting register $240_1$ so that a capture timing is put at the middle of a period of time during which the H or L level continues, the following configuration may be possessed.

Figure 12:
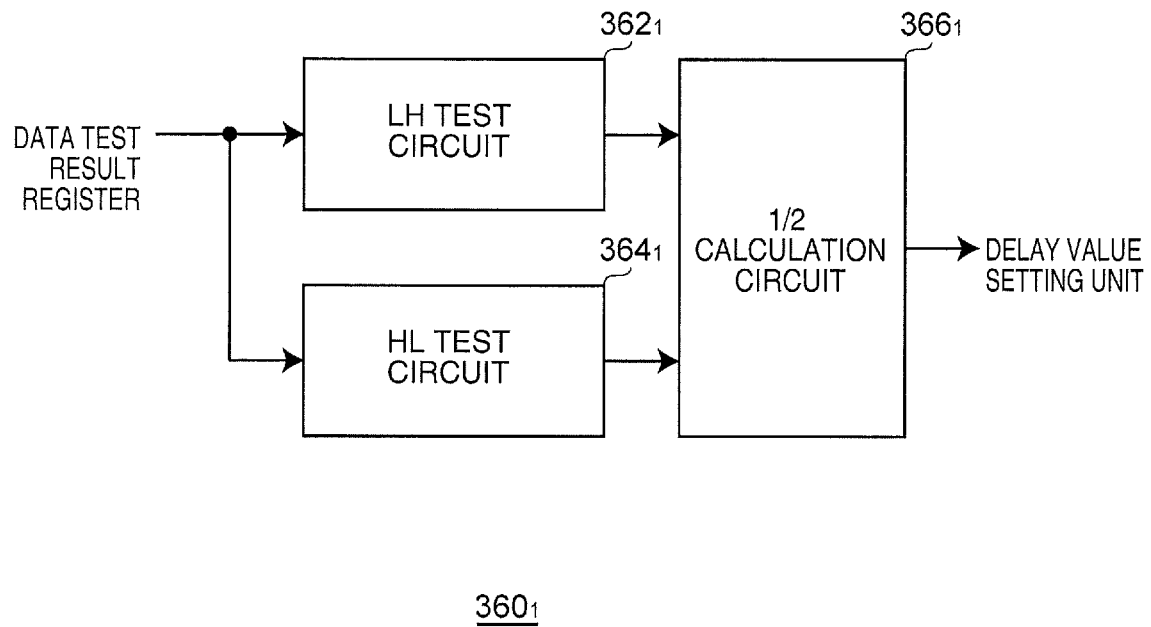
FIG. 12 is a block diagram of an example configuration of a delay value adjustment unit of FIG. 11.

FIG. 12 shows a block diagram of an example configuration of the delay value adjustment unit $360_1$ of FIG. 11.

The delay value adjustment unit $360_1$ includes an LH test circuit $362_1$, an HL test circuit $364_1$, and a ½ calculation circuit $366_1$. The LH test circuit $362_1$ tests a timing t1 at which a change occurs from the L level to the H level based on the test result value set in the data test result register $248_1$. The HL test circuit $364_1$ tests a timing t2 at which a change occurs from the H level to the L level based on the test result value set in the data test result register $248_1$. The ½ calculation circuit $366_1$ calculates an intermediate value (=(t1+t2)/2) between the timing t1 tested by the LH test circuit $362_1$ and the timing t2 tested by the HL test circuit $364_1$ as an optimum delay value.

As a result, the delay value setting unit $320_1$ into which the optimum delay value is input can be set so that the delay circuit $234_1$ delays a data signal by an optimum delay time using the delay value and outputs the resultant data signal.

As described above, according to the second embodiment, similar to the first embodiment, while the delay time of a data signal from each transmitter circuit is shifted, an optimum delay time is determined in a corresponding receiver circuit, and therefore, a data signal can be captured at the optimum delay times. As a result, the receiver circuit can capture a high-speed signal without providing a PLL circuit. Also, the delay time of a data signal can be adjusted, taking into consideration the timing tolerance values of transmitter and receiver circuits, mounting factors in a COF etc., fluctuations in inductance due to flexure of a COF etc., a difference between each flexure degree, etc.

Third Embodiment

The first embodiment has been described, assuming that the CPU detects deviations of cross points of a data signal and a capture clock signal. The present invention is not limited to this.

Figure 13:
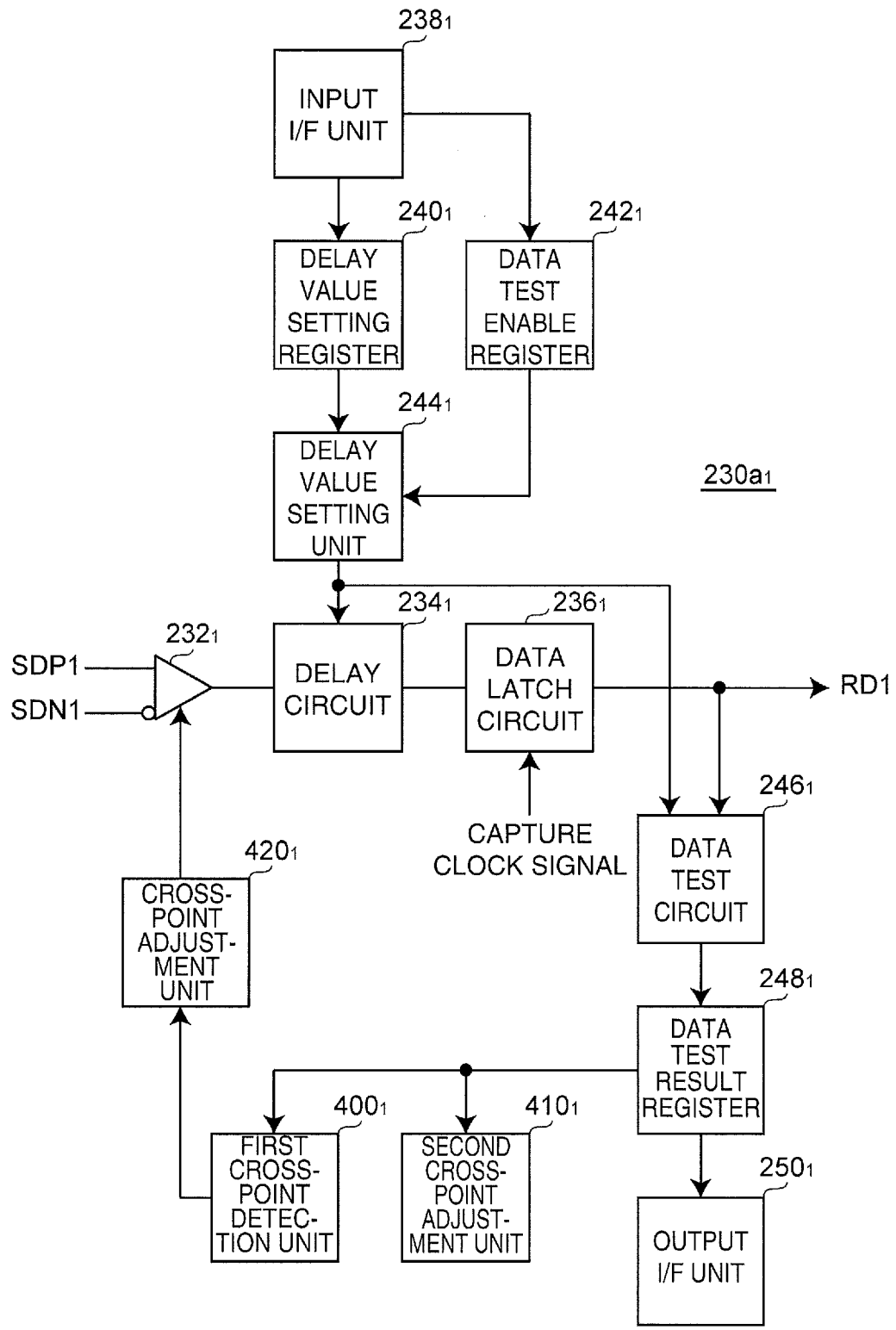
FIG. 13 is a block diagram of an example configuration of a first receiver circuit in a third embodiment.

FIG. 13 shows a block diagram of an example configuration of a first receiver circuit in a third embodiment. In FIG. 13, parts similar to those of FIG. 3 are indicated by the same reference characters and will not be redundantly described.

A first receiver circuit $230_{a1}$ in the third embodiment is different from the first receiver circuit $230_1$ in that a first cross-point detection unit $400_1$, a second cross-point detection unit $410_1$, and a cross point adjustment unit $420_1$ are additionally provided.

The first cross-point detection unit $400_1$ performs the detection process of step S12 of FIG. 6 based on the test result value. Specifically, the first cross-point detection unit $400_1$, when determining that a cycle of time during which the H or L level continues is longer than the period of the capture timing, detects a deviation of a cross point of a data signal.

The second cross-point detection unit $410_1$ performs the detection process of step S14 of FIG. 6 based on the test result value. Specifically, the second cross-point detection unit $410_1$, when determining that a period of time during which the H or L level continues when captured at the falling edge, rising edge, and falling edge of the capture clock signal in this order, is different from a period of time during which the H or L level continues when captured at the rising edge, falling edge, and rising edge of the capture clock signal in this order, detects a deviation of a cross point of the capture clock signal.

The cross point adjustment unit $420_1$, when the first cross-point detection unit $400_1$ detects a deviation of a cross point of a data signal, controls a drive unit of the differential receiver $232_1$ to change the current drive ability to drive at least one of a pair of differential signals. In this case, the cross point adjustment unit $136_1$ of the transmitter circuit may be removed.

Also, when the second cross-point detection unit $410_1$ detects a deviation of a cross point of the capture clock signal, the CPU controls the cross point adjustment unit 126 of the clock transmitter circuit 120. In this case, the cross point adjustment unit 126 controls a drive unit of the differential transmitter 124 to change the current drive ability to drive at least one of a pair of differential signals.

Note that the first cross-point detection unit $400_1$, the second cross-point detection unit $410_1$, and the cross point adjustment unit $420_1$ of FIG. 13 may be added to the configuration of the second embodiment.

As described above, according to the third embodiment, in addition to the advantages of the above embodiments, the cross points of the data signal and the capture clock signal can be adjusted. As a result, a high-speed signal can be captured more correctly.

Fourth Embodiment

The third embodiment has been described, assuming that when a deviation of a cross point of the capture clock signal is detected, the transmitter adjusts the deviation of the cross point of the capture clock signal. The present invention is not limited to this.

Figure 14:
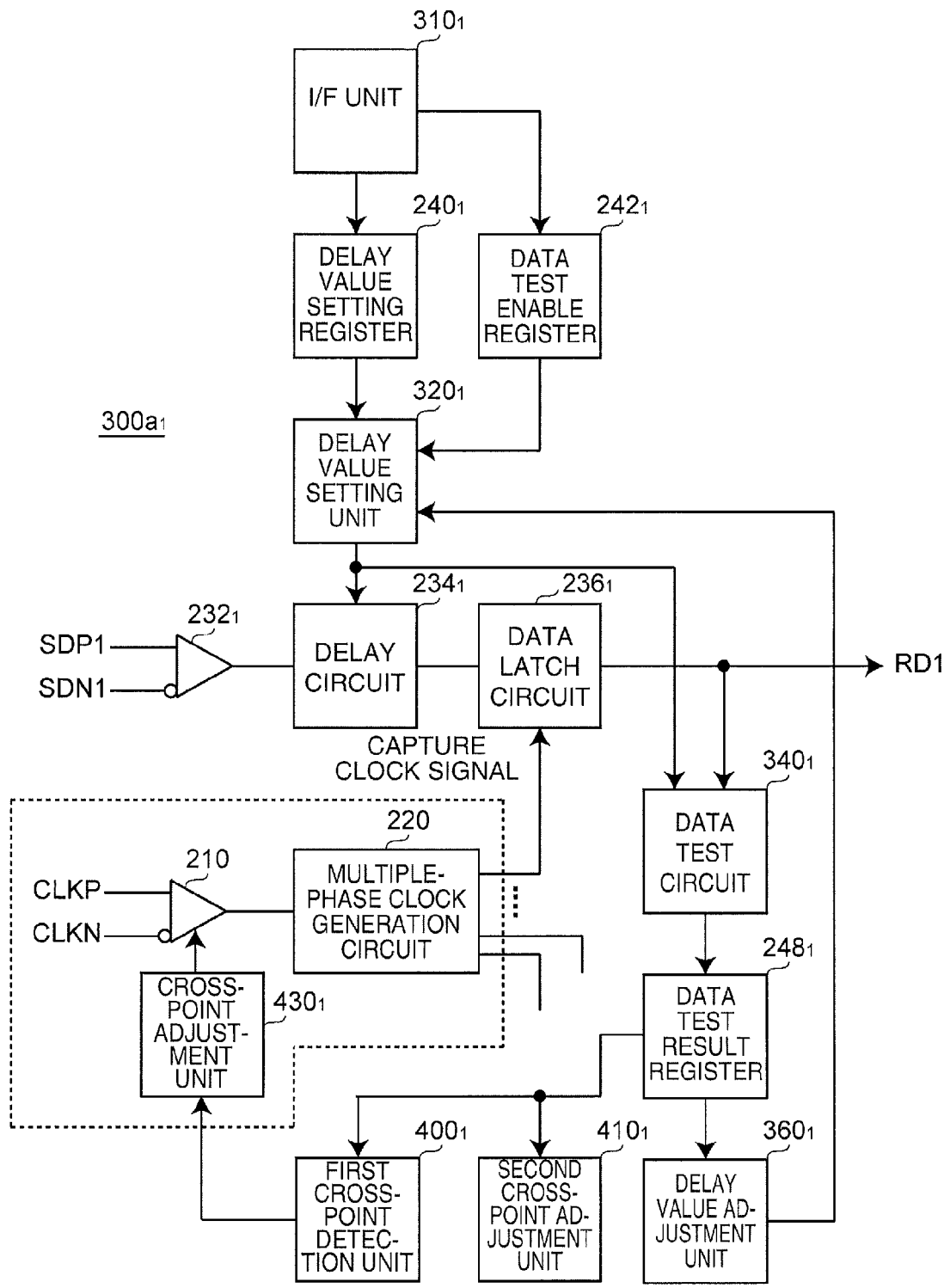
FIG. 14 is a block diagram of an example configuration of a first receiver circuit in a fourth embodiment.

FIG. 14 shows a block diagram of an example configuration of a first receiver circuit in a fourth embodiment. In FIG. 14, parts similar to those of FIG. 2, 10, or 13 are indicated by the same reference characters and will not be redundantly described. Note that, in FIG. 14, the clock receiver 210 and the multiple-phase clock generation circuit 220 of FIG. 2 are also shown.

The first receiver circuit $300_{a1}$ of the fourth embodiment is different from the first receiver circuit $300_1$ in that a first cross-point detection unit $400_1$ and a second cross-point detection unit $410_1$ are additionally provided. Also, a cross point adjustment unit $430_1$ is connected to the clock receiver 210 included in the receiver 200.

The first cross-point detection unit $400_1$ and the second cross-point detection unit $410_1$ are similar to those of FIG. 13. The cross point adjustment unit $430_1$, when the second cross-point detection unit $410_1$ detects a deviation of a cross point of the capture clock signal, controls a drive unit of the clock receiver 210 to change the current drive ability to drive at least one of a pair of differential signals. In this case, the cross point adjustment unit 126 of the clock transmitter circuit 120 may be removed.

Note that the first cross-point detection unit $400_1$, the second cross-point detection unit $410_1$, and the cross point adjustment unit $430_1$ of FIG. 14 may be added to the configuration of the first embodiment.

As described above, according to the fourth embodiment, in addition to the advantages of the above embodiments, the cross points of the capture clock signal can be adjusted in the receiver circuit. As a result, a high-speed signal can be captured more correctly.

(Electronic Device)

A display module in which a communication system to which a receiver circuit of any of the above embodiments is applied is mounted may, for example, be applied to the following electronic devices.

Figure 15A:
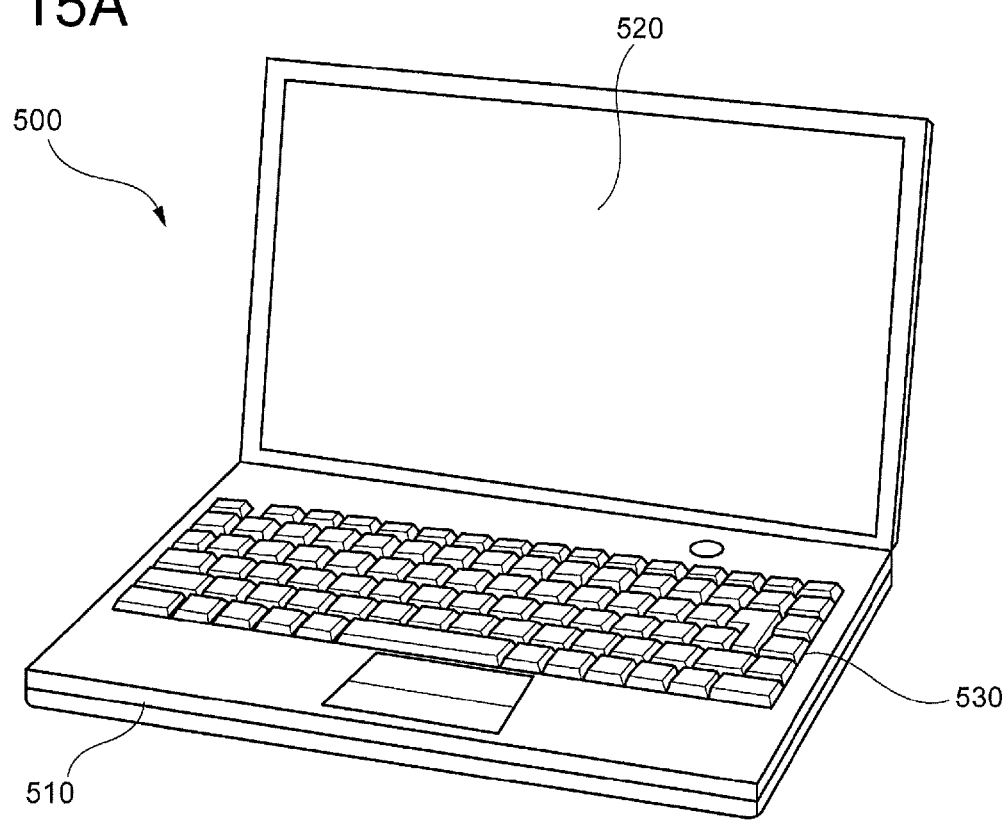
FIG. 15(A) is a perspective view of a configuration of a mobile personal computer.
Figure 15B:
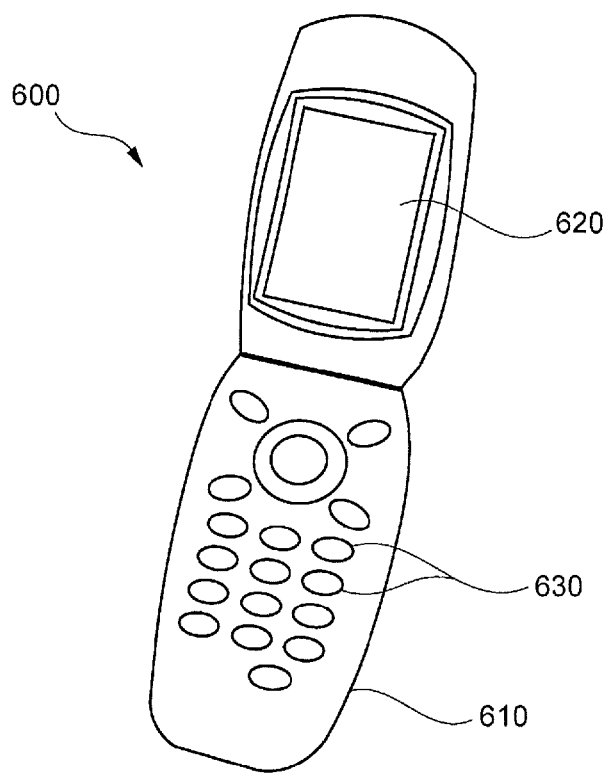
FIG. 15(B) is a perspective view of a configuration of a mobile telephone.

FIGS. 15(A) and 15(B) show perspective views showing configurations of electronic devices having a display module in which a communication system to which a receiver circuit of any of the above embodiments is applied is mounted. FIG. 15(A) shows a perspective view of a configuration of a mobile personal computer. FIG. 15(B) shows a perspective view of a configuration of a mobile telephone.

The personal computer 500 of FIG. 15(A) includes a body 510 and a display unit 520. The display unit 520 includes a display module in which a communication system to which a receiver circuit of any of the above embodiments is applied is mounted. In other words, the personal computer 500 includes at least a display module in which a communication system to which a receiver circuit of any of the above embodiments is applied is mounted. A keyboard 530 is provided to the body 510. Operation information input via the keyboard 530 is analyzed by a control unit (not shown), so that an image is displayed on the display unit 520, corresponding to the operation information. The display unit 520 can transmit and receive a high-speed signal, and therefore, the personal computer 500 which can provide a very high-definition display can be provided at low cost.

The mobile telephone 600 of FIG. 15(B) includes a body 610 and a display unit 620. The display unit 620 includes a display module in which a communication system to which a receiver circuit of any of the above embodiments is applied is mounted. In other words, the mobile telephone 600 includes a display module in which a communication system to which a receiver circuit of any of the above embodiments is applied is mounted. A key 630 is provided to the body 610. Operation information input via the key 630 is analyzed by a control unit (not shown), so that an image is displayed on the display unit 620, corresponding to the operation information. The display unit 620 can transmit and receive a high-speed signal, and therefore, the mobile telephone 600 which can provide a very high-definition display can be provided at low cost.

Note that electronic devices in which a communication system to which a receiver circuit of any of the above embodiments is applied is mounted are not limited to those shown in FIGS. 15(A) and 15(B). Examples of such an electronic device include mobile information terminals (PDAs: Personal Digital Assistants), digital still cameras, televisions, video cameras, automotive navigation devices, pagers, electronic organizers, electronic paper, electronic calculators, word processors, workstations, videophones, POS (Point of sale system) terminals, printers, scanners, copiers, video players, devices equipped with a touch panel, etc. According to any of the above embodiments, in the above electronic devices, a high-speed signal can be accurately received, which contributes to implementation of high-capacity and high-speed processing.

In the foregoing, the receiver circuit, the communication system, the receiver circuit control method, etc. of the present invention have been described based on any of the above embodiments. The present invention is not limited to any of the above embodiments. For example, the present invention can be carried out in various embodiments without departing the scope of the present invention, and the following variations can be made.

(1) In any of the above embodiments, an example in which a communication system including the receiver circuit of the present invention is mounted in a display module has been described. The present invention is not limited to this. Specifically, a communication system including the receiver circuit of the present invention is, of course, applicable to something which is not involved in displaying.

(2) In any of the above embodiments, an example in which a transmitter circuit transmits differential signals to a receiver circuit has been described. The present invention is not limited to this. Specifically, the present invention is not limited to the example in which a transmitter circuit transmits differential signals to a receiver circuit.

(3) In any of the above embodiments, the display driver 44 has been assumed to be mounted on a COF. The present invention is not limited to this. The display driver 44 may be mounted on a TCP. Alternatively, the display driver 44 may be mounted on a substrate or film other than the PCB 20.

(4) In any of the above embodiments, an example in which an optimum delay value is obtained by calculation using five delay values as shown in FIGS. 7(A) to 7(E) has been described. The present invention is not limited to this. For example, an optimum delay value may be more accurately obtained using 32 or 64 delay values.

(5) In any of the above embodiments, the present invention has been described as a receiver circuit, a communication system, an electronic device, a receiver circuit control method, etc. The present invention is not limited to this. For example, the present invention may be a program in which a procedure of the receiver circuit control method of the present invention is described, or a recording medium storing the program.

REFERENCE SIGNS LIST

10 DISPLAY MODULE
20 PCB
22 DISPLAY CONTROLLER
30 PANEL SUBSTRATE
40 COF
42 CONNECTOR
44 DISPLAY DRIVER
100 TRANSMITTER
100 PLL CIRCUIT
120 CLOCK TRANSMITTER CIRCUIT
122, 132$_1$ TO 132$_8$ PS CONVERSION UNIT
124, 134$_1$ TO 134$_8$ DIFFERENTIAL TRANSMITTER
126, 136$_1$ TO 136$_8$, 420$_1$, 430$_1$ CROSS POINT ADJUSTMENT UNIT
130$_1$ TO 130$_8$ FIRST TO EIGHTH TRANSMITTER CIRCUITS
200 RECEIVER
210 CLOCK RECEIVER
220 MULTIPLE-PHASE CLOCK GENERATION CIRCUIT
230$_1$, 230$_{a1}$, 300$_{a1}$, 300$_1$ FIRST RECEIVER CIRCUIT (RECEIVER CIRCUIT)
230$_2$ TO 230$_8$ SECOND TO EIGHTH RECEIVER CIRCUITS
232$_1$ TO 232$_8$ DIFFERENTIAL RECEIVER
234$_1$ TO 234$_8$ DELAY CIRCUIT
236$_1$ TO 236$_8$ DATA LATCH CIRCUIT
238$_1$ INPUT I/F UNIT
240$_1$ DELAY VALUE SETTING REGISTER
242$_1$ DATA TEST ENABLE REGISTER
244$_1$, 320$_1$ DELAY VALUE SETTING UNIT
246$_1$, 340$_1$ DATA TEST CIRCUIT
248$_1$ DATA TEST RESULT REGISTER
250$_1$ OUTPUT I/F UNIT
310$_1$ I/F UNIT
322$_1$ CONDITION SETTING REGISTER
324$_1$ TEST DELAY COUNTER
326$_1$ DELAY TEST REGISTER
328$_1$ DELAY SWITCH
342$_1$ ADDRESS DECODER
344$_1$ DATA LATCH
346$_1$ TEST CIRCUIT
360$_1$ DELAY VALUE ADJUSTMENT UNIT
362$_1$ LH TEST CIRCUIT
364$_1$ HL TEST CIRCUIT
366$_1$ ½ CALCULATION CIRCUIT
400$_1$ FIRST CROSS-POINT DETECTION UNIT
410$_1$ SECOND CROSS-POINT DETECTION UNIT

The invention claimed is:

1. A receiver circuit for capturing an input signal at a plurality of capture timings determined based on a capture clock signal, comprising:
   a delay circuit configured to delay the input signal changing to a first state or a second state by a set delay time, and output the delayed input signal;
   a latch circuit configured to capture the input signal delayed by the delay circuit at each capture timing;
   a data test circuit configured to test a latch signal captured by the latch circuit; and
   a data test result register configured so that a test result value corresponding to a test result of the data test circuit is set therein,
   wherein
   the data test circuit compares the latch signal captured by the latch circuit at each capture timing with an expected value, and outputs the result of the comparison and includes a first cross-point detection unit configured to, when it is determined based on the test result value that a period of time during which the first or second state continues is longer than a cycle of the capture timing, detect a deviation of a cross point of the input signal input as differential signals.

2. The receiver circuit according to claim 1, comprising:
   a delay value adjustment unit configured to adjust the delay time of the delay circuit based on the test result value so that latch data corresponding to a latch signal captured at each capture timing with respect to each of different delay times set in the delay circuit matches a predetermined first pattern.

3. The receiver circuit according to claim 1, comprising:
   a delay value adjustment unit configured to adjust the delay time of the delay circuit based on the test result value so that each capture timing is the middle of a period of time during which the first or second state continues.

4. The receiver circuit according to claim 1,
   wherein
   the delay circuit changes at least one of a current drive ability of a delay element included in the delay circuit and the number of delay elements on a signal path of an output signal thereof.

5. The receiver circuit according to claim 1,
   wherein
   the data test circuit tests the latch signal at least one of a timing after initiation of an operation of the receiver circuit, a timing before start of displaying using the input signal, and a timing during a blanking interval of displaying using the input signal.

6. The receiver circuit according to claim 1, comprising:
   a second cross-point detection unit configured to, when it is determined based on the test result value that a period of time during which the first or second state continues when captured at a falling edge, rising edge, and falling edge of the capture clock signal in this order, is different from a period of time during which the first or second state continues when captured at a rising edge, falling edge, and rising edge of the capture clock signal in this order, detect a deviation of a cross point of the capture clock signal input as differential signals.

7. The receiver circuit according to claim 6, comprising: a cross point adjustment unit configured to, when the second cross-point detection unit detects a deviation of a cross point of the capture clock signal, adjusts the cross point of the capture clock signal.

8. A communication system comprising:
the receiver circuit according to claim 1; and
a transmitter circuit configured to transmit the input signal to the receiver circuit.

9. A communication system comprising:
the receiver circuit of claim 1; and
a transmitter circuit configured to transmit the input signal to the receiver circuit,
wherein
the transmitter circuit, when the first cross-point detection unit detects a deviation of a cross point of the input signal, adjusts the cross point of the input signal.

10. A communication system comprising:
the receiver circuit of claim 6; and
a transmitter circuit configured to transmit the input signal to the receiver circuit,
wherein
the transmitter circuit, when the second cross-point detection unit detects a deviation of a cross point of the capture clock signal, adjusts the cross point of the capture clock signal.

11. An electronic device comprising the communication system according to claim 8.

12. A method for controlling a receiver circuit for capturing an input signal at a plurality of capture timings determined based on a capture clock signal, comprising:
a delay control step of delaying the input signal changing to a first state or a second state by a set delay time, and outputting the delayed input signal;
a latch step of capturing the input signal delayed by the delay control step at each capture timing;
a data test step of testing a latch signal captured by the latch step; and
a delay value adjustment step of adjusting the delay time based on a test result of the data test step,
wherein
in the data test step, the latch signal captured at each capture timing is compared with an expected value, and includes a first cross-point detection step of, when it is determined based on the test result value that a period of time during which the first or second state continues is longer than a cycle of the capture timing, detecting a deviation of a cross point of the input signal input as differential signals.

13. A receiver circuit for capturing an data signal at a plurality of capture timings determined based on a capture clock signal, comprising:

a delay circuit configured to delay the data signal changing to a first state or a second state by a set delay time, and output the delayed data signal;
a latch circuit configured to capture the data signal delayed by the delay circuit at each capture timing;
a data test circuit configured to test a latch signal captured by the latch circuit; and
a data test result register configured so that a test result value corresponding to a test result of the data test circuit is set therein,
wherein
the data test circuit compares the latch signal captured by the latch circuit at each capture timing with an expected value, and outputs the result of the comparison.

14. The receiver circuit according to claim 13, comprising:
a delay value adjustment unit configured to adjust the delay time of the delay circuit based on the test result value so that latch data corresponding to a latch signal captured at each capture timing with respect to each of different delay times set in the delay circuit matches a predetermined first pattern.

15. The receiver circuit according to claim 13, comprising:
a delay value adjustment unit configured to adjust the delay time of the delay circuit based on the test result value so that each capture timing is the middle of a period of time during which the first or second state continues.

16. The receiver circuit according to claim 13, wherein
the delay circuit changes at least one of a current drive ability of a delay element included in the delay circuit and the number of delay elements on a signal path of an output signal thereof.

17. The receiver circuit according to claim 13, wherein
the data test circuit tests the latch signal at least one of a timing after initiation of an operation of the receiver circuit, a timing before start of displaying using the data signal, and a timing during a blanking interval of displaying using the data signal.

18. A communication system comprising:
the receiver circuit according to claim 13; and
a transmitter circuit configured to transmit the data signal to the receiver circuit.

19. An electronic device comprising the communication system according to claim 18.

20. A method for controlling a receiver circuit for capturing a data signal at a plurality of capture timings determined based on a capture clock signal, comprising:
a delay control step of delaying the data signal changing to a first state or a second state by a set delay time, and outputting the delayed data signal;
a latch step of capturing the data signal delayed by the delay control step at each capture timing;
a data test step of testing a latch signal captured by the latch step; and
a delay value adjustment step of adjusting the delay time based on a test result of the data test step,
wherein
in the data test step, the latch signal captured at each capture timing is compared with an expected value.

* * * * *